(12) United States Patent
Kawazoe et al.

(10) Patent No.: US 8,409,347 B2
(45) Date of Patent: Apr. 2, 2013

(54) METHOD OF DOPANT INJECTION, N-TYPE SILICON SINGLE-CRYSTAL, DOPING APPARATUS AND PULL-UP DEVICE

(75) Inventors: Shinichi Kawazoe, Omura (JP);
Yasuhito Narushima, Omura (JP);
Toshimichi Kubota, Omura (JP)

(73) Assignee: Sumco TechXIV Corporation, Nagasaki (JP)

( * ) Notice: Subject to any disclaimer, the term of this patent is extended or adjusted under 35 U.S.C. 154(b) by 921 days.

(21) Appl. No.: 12/374,477

(22) PCT Filed: Jul. 20, 2007

(86) PCT No.: PCT/JP2007/064362
§ 371 (c)(1),
(2), (4) Date: Jan. 20, 2009

(87) PCT Pub. No.: WO2008/010577
PCT Pub. Date: Jan. 24, 2008

(65) Prior Publication Data
US 2009/0314996 A1    Dec. 24, 2009

(30) Foreign Application Priority Data

Jul. 20, 2006  (JP) ................................. 2006-198669
Jul. 20, 2006  (JP) ................................. 2006-198670
Sep. 29, 2006  (JP) ................................. 2006-267264

(51) Int. Cl.
*C30B 15/00* (2006.01)
*C30B 21/06* (2006.01)
*C30B 27/02* (2006.01)
*C30B 28/10* (2006.01)
*C30B 30/04* (2006.01)

(52) U.S. Cl. .......................................... 117/21; 118/715

(58) Field of Classification Search .................. None
See application file for complete search history.

(56) References Cited

U.S. PATENT DOCUMENTS 3,002,821 A  * 10/1961 Haron ........................... 117/213
(Continued)

FOREIGN PATENT DOCUMENTS

JP         55-47450 A    11/1980
JP         59-156993 A    9/1984
(Continued)

OTHER PUBLICATIONS

International Preliminary Report on Patentability and Written Opinion of the International Searching Authority (7 pages) dated Jan. 20, 2009, issued in counterpart International Application Serial No. PCT/JP2007/064362.

(Continued)

*Primary Examiner* — Kaj K Olsen
*Assistant Examiner* — Ross J Christie
(74) *Attorney, Agent, or Firm* — Holtz, Holtz, Goodman & Chick, P.C.

(57) ABSTRACT

In a dopant-injecting method for injecting a volatile dopant into a semiconductor melt, a doping device having an accommodating portion for accommodating a solid dopant and a cylindrical portion into which a gas ejected from the accommodating portion is introduced, a lower end surface of the cylindrical portion being opened to guide the gas to the melt, is used. The sublimation rate of the dopant in the accommodating portion is set in a range from 10 g/min to 50 g/min. Since a flow volume of the volatilized dopant gas is controlled by setting the sublimation rate of the dopant gas in the accommodating portion in the range from 10 g/min to 50 g/min, the melt is not blown off when the gas is blown onto the melt.

10 Claims, 21 Drawing Sheets

U.S. PATENT DOCUMENTS

| | | | | |
|---|---|---|---|---|
| 3,591,340 | A | * | 7/1971 | Plaskett .......................... 117/77 |
| 3,881,037 | A | * | 4/1975 | Grandia et al. ................. 117/56 |
| 5,242,862 | A | * | 9/1993 | Okabe et al. ................... 438/268 |
| 2003/0061985 | A1 | * | 4/2003 | Kulkarni et al. ................ 117/19 |

FOREIGN PATENT DOCUMENTS

| JP | 09-263479 A | 10/1997 |
|---|---|---|
| JP | 2000-281500 A | 10/2000 |
| JP | 2001-253791 A | 9/2001 |
| JP | 2001-342094 A | 12/2001 |
| JP | 2004-137140 A | 5/2004 |
| JP | 2005-247671 A | 9/2005 |

OTHER PUBLICATIONS

English Language International Search Report dated Oct. 16, 2007 issued in parent Appln. No. PCT/JP2007/064362.

* cited by examiner

US 8,409,347 B2

METHOD OF DOPANT INJECTION, N-TYPE SILICON SINGLE-CRYSTAL, DOPING APPARATUS AND PULL-UP DEVICE

This application is a U.S. National Phase Application under 35 USC 371 of International Application PCT/JP2007/064362 filed Jul. 20, 2007.

TECHNICAL FIELD

The present invention relates to an injecting method of dopant, an N-type silicon monocrystal, a doping device and a pull-up device.

BACKGROUND ART

Traditionally, in order to adjust resistance value of semiconductor silicon wafers, microelements (dopants) such as phosphorous and arsenic are doped while developing N-type silicon monocrystals.

The doping on silicon monocrystals produced by Czochralski method is conducted by blowing a gas in which the microelements are volatilized onto silicon melt (see e.g. JP-A-2001-342094 (P. 3-6, FIGS. 1, 2)) or by directly adding solid microelements into silicon melt (see e.g. JP-A-2004-137140 (P. 5-7, FIG. 4)).

In order to blow the microelement gas to silicon melt, solid microelement is initially housed in an accommodating portion of a doping device. Then, the solid microelement is vaporized in a high-temperature atmosphere in a chamber of a pull-up device, thus blowing the microelement gas to the surface of the silicon melt.

Alternatively, in order to directly add a solid microelement into silicon melt, the solid microelement is put into an injection tube (doping device) having sealed upper and lateral portions and a latticed (netted) lower portion. The lower portion of the injection tube is immersed in the silicon melt to vaporize the microelement by the temperature of the silicon melt.

DISCLOSURE OF THE INVENTION

Problems to Be Solved by the Invention

However, according to the above first method, since the microelement gas is blown only to the same part on the surface of the silicon melt, it is difficult for the gas to be dissolved into the silicon melt, or the gas is discharged out of the furnace without touching the silicon melt. On the other hand, when the solid dopant is vaporized by the heat of the silicon melt to blow the dopant gas to the silicon melt, since the atmospheric temperature of the silicon melt is much higher than sublimation temperature of the dopant, the dopant is instantaneously sublimated. Accordingly, the pressure within the storage is greatly increased relative to the outside of the storage, so that the dopant gas is vigorously blown to the silicon melt.

Further, when the dopant is rapidly sublimated, since the blowing pressure of the dopant gas becomes excessively high, the dopant gas outbursts too fast to be dissolved in the melt, so that only a tiny fraction of the added dopant is dissolved into the melt, thereby deteriorating absorption rate.

Further, since the silicon melt is blown off by the dopant gas, the blown-off fraction of silicon hinders the formation of monocrystal to make it difficult to manufacture a semiconductor wafer having a desired resistance value.

Furthermore, in any of the above dopant-injecting methods, it is difficult to manufacture a semiconductor wafer having a desired resistance value.

An object of the present invention is to provide an injecting method of dopant capable of manufacturing a semiconductor wafer having a desired resistance value, and an N-type silicon monocrystal manufactured by the dopant injecting method.

Another object of the invention is to provide a dopant-injecting method and a doping device capable of enhancing a doping efficiency of a dopant into a silicon melt.

Still another object of the invention is to provide a doping device capable of manufacturing a semiconductor wafer having a desired resistance value and a pull-up device having the doping device.

Means for Solving the Problems

After vigorous research of the inventors of the invention, it was estimated that, since the heat of the silicon melt is enormously large relative to a sublimation rate of microelement, the microelement is rapidly sublimated to blow an intensive jet of the microelement gas onto the silicon melt in the above-described dopant-injecting method. Since an extremely large amount of microelement gas is blown, blowing pressure of the dopant gas becomes excessively high, so that the dopant gas outbursts too rapidly to be dissolved in the melt, so that only a tiny fraction of the added dopant is dissolved into the melt, thereby deteriorating absorption rate. Further, the formation of monocrystal is hindered by the blown-off silicon to make it difficult to manufacture semiconductor wafers having a desired resistance value.

The present invention has been devised on the basis of knowledge as described above.

A dopant-injecting method according to an aspect of the invention is for injecting a volatile dopant into a semiconductor melt, which includes: providing a doping device including an accommodating portion that accommodates a solid dopant and a cylindrical portion into which a gas ejected from the accommodating portion is introduced, the cylindrical portion having an opening on a lower end surface to guide the gas to the melt; and setting a sublimation rate of the dopant in the accommodating portion in a range from 10 g/min to 50 g/min.

In the invention, the melt may be doped with the cylindrical portion of the doping device being immersed in the melt. Alternatively, the melt may be doped without immersing the cylindrical portion in the melt.

According to the above aspect of the invention, since a flow volume of the volatilized dopant gas is controlled by setting the sublimation rate of the dopant gas in the accommodating portion in the range from 10 g/min to 50 g/min, the melt is not blown off when the gas is blown onto the melt.

Further, since it can be prevented that time allowance for dissolving the dopant into the melt is lost on account of excessively ejected dopant gas, the dopant can be sufficiently dissolved into the melt, so that absorption rate is not deteriorated. Further, it can be prevented that the formation of monocrystal is hindered by the blown-off silicon to make it difficult to manufacture semiconductor wafers having a desired resistance value.

In the above aspect of the invention, it is preferable that the semiconductor melt is a silicon melt; the doping device is provided with a blow-preventing member above the accommodating portion, the blow-preventing member preventing an inert gas flowing from above to below the accommodating portion from being directly blown to the accommodating portion, the doping device being disposed in a chamber of a pull-up device accommodating a crucible containing the melt; and when the dopant is injected, following conditions (A) to (C) are satisfied: (A) a temperature of the melt is in a range from a melting point of silicon and a point 60° C. above the melting point; (B) a flow volume of the inert gas flowing from above to below the accommodating portion of the doping device is in a range from 50 litters/min to 400 litters/min; and (C) a pressure inside the chamber is set in a range from 5332 Pa (converted value of 40 Torr) to 79980 Pa (converted value of 600 Torr).

When the temperature of the melt is lower than the melting point of silicon, the dopant gas absorption may be hindered. On the other hand, when the melt temperature exceeds the point 60° C. above the melting point, the melt may be boiled. Further, evaporation of dopant gas absorbed in the melt may be promoted to deteriorate the absorption rate of the dopant.

When the pressure inside the chamber is 5332 Pa (converted value of 40 Torr), the dopant dissolved in the melt may be easily volatilized.

On the other hand, when the pressure inside the chamber exceeds 79980 Pa (converted value of 600 Torr), high pressure resistance and heat resistance are required for the chamber, which incurs additional production cost.

The flow volume of the inert gas flowing from above to below the accommodating portion of the doping device is in a range from 50 litters/min to 400 litters/min. Accordingly, the accommodating portion can be cooled by the inert gas, thus allowing adjustment of the sublimation rate of the dopant in the accommodating portion.

When the flow volume of the inert gas is set to exceed 400 litters/min, the accommodating portion may be too cooled to volatilize the dopant.

In the above aspect of the invention, it is preferable that the semiconductor melt is a silicon melt; the doping device is provided with a blow-preventing member above the accommodating portion, the blow-preventing member preventing an inert gas flowing from above to below the accommodating portion from being directly blown to the accommodating portion, the doping device being disposed in a chamber of a pull-up device accommodating a crucible containing the melt; and when the dopant is injected, following conditions (D) to (F) are satisfied: (D) a temperature of the melt is in a range from a melting point of silicon and a point 60° C. above the melting point; (E) a flow volume of the inert gas flowing from above to below the accommodating portion of the doping device is in a range from 50 litters/min to 400 litters/min; and (F) a flow rate of the inert gas at an entrance of the chamber is in a range from 0.05 m/s to 0.2 m/s.

The entrance of chamber refers to a border area between the chamber and a pulling-up chamber.

According to the above arrangement, since the sublimation rate of the dopant can be set within an appropriate range by controlling the flow rate at the entrance of the chamber, the melt is not blown off.

In the above aspect of the invention, it is preferable that a diameter of the opening of the cylindrical portion is 20 mm or more.

Since the diameter of the opening of the cylindrical portion, i.e. the ejecting opening of the gas, is 20 mm or more, when the sublimation rate of the dopant in the accommodating portion is set in the range from 10 g/min to 50 g/min, the volatilized dopant gas is not vigorously blown onto the melt, so that blow-off of the melt can be reliably avoided.

Further, in the above aspect of the invention, the dopant accommodated in the accommodating portion of the doping device is located higher than a surface of the melt by 300 mm or more.

If the position of the dopant is located very close to the surface of the melt when being doped, the dopant is disposed in a high temperature atmosphere due to the heat of the melt, so that it may become difficult to control the sublimation rate of the dopant.

In this arrangement, since the position of the dopant is located 300 mm or more above the surface of the melt, the sublimation rate of the dopant can be reliably controlled.

In the above aspect of the invention, it is preferable that the dopant gas is injected while a part of the melt on which the dopant gas is blown is being stirred.

According to the above arrangement, since the dopant gas is injected while stirring the part of the melt on which the dopant gas is blown, the melt being in contact with the gas does not stay the same but is constantly renewed. Accordingly, the gas can be efficiently brought into contact with the melt into which the gas is dissolved, so that the doping efficiency can be enhanced.

In the above aspect of the invention, it is preferable that the doping device includes a plurality of heat-shielding members that cover a lower side of the accommodating portion to block a radiant heat from the melt, and the dopant is injected with a position and a number of the plurality of heat-shielding members being adjusted.

According to the above arrangement, since the sublimation rate of the dopant in the accommodating portion can be adjusted by adjusting the position and the number of the heat-shielding members, the sublimation rate of the dopant can be set as desired.

In the dopant-injecting method according to the above aspect of the invention, it is preferable that a doping device including an accommodating portion that accommodates a solid dopant and a tube portion into which the gas ejected from the accommodating portion is introduced is used, the tube portion having an open lower end surface and a lower end immersed in the melt; a through-hole is provided on the tube portion of the doping device at a portion immersed in the melt, and the melt is introduced into an interior of the tube portion through the through-hole or is ejected from the interior of the tube through the through-hole when at least one of the doping device and a crucible containing the melt is driven to stir the portion of the melt on which the dopant gas is blown.

With the use of the above doping device, since the outer tube protruding toward the melt relative to the inner tube of the doping device is provided, the gas ejected from the cylindrical portion of the inner tube is introduced to the outer tube. Since the through-hole is provided on the outer tube and the melt is introduced into the interior of the outer tube or is ejected from the interior of the outer tube through the through-hole when the doping device and/or the crucible containing the melt is driven, the melt inside the cylindrical portion, i.e. the melt in contact with the gas, is exchanged by the stirring.

Accordingly, it is facilitated for the gas in the outer tube to be dissolved in the melt, so that the doping efficiency can be enhanced.

A dopant-injecting method according to another aspect of the invention is for injecting volatilized dopant gas into a semiconductor melt, the method including: injecting the dopant gas while a part of the melt on which the dopant gas is blown is being stirred.

According to the above arrangement, since the dopant gas is injected while stirring the part of the melt on which the dopant gas is blown, the melt being in contact with the gas does not stay the same but is constantly renewed. Accordingly, the dopant gas can be efficiently brought into contact with the melt in which the gas is not dissolved, so that the doping efficiency can be enhanced.

In the above aspect of the invention, it is preferable that a doping device including an accommodating portion that accommodates a solid dopant and a tube portion into which the gas ejected from the accommodating portion is introduced is used, the tube portion having an open lower end surface and a lower end immersed in the melt; a through-hole is provided on the tube portion of the doping device at a portion immersed in the melt, and the melt is introduced into an interior of the tube portion through the through-hole or is ejected from the interior of the tube through the through-hole when at least one of the doping device and a crucible containing the melt is driven to stir the portion of the melt on which the dopant gas is blown.

According to the above arrangement, since the through-hole is provided on the tube portion into which the gas ejected from the accommodating portion of the doping device is introduced is provided and the melt is introduced into the interior of the tube portion or is ejected from the interior of the tube portion through the through-hole when the doping device and/or the crucible containing the melt is driven, the melt inside the tube portion, i.e. the melt in contact with the gas, is exchanged by the stirring.

Accordingly, it is facilitated for the gas in the tube portion to be dissolved in the melt, so that the doping efficiency can be enhanced.

Further, since it can be prevented that time allowance for dissolving the dopant into the melt is lost on account of excessively ejected dopant gas, the dopant can be sufficiently dissolved into the melt, so that absorption rate is not deteriorated. Further, it can be prevented that the formation of monocrystal is hindered by the blown-off silicon to make it difficult to manufacture semiconductor wafers having a desired resistance value.

In the above aspect of the invention, it is preferable that a vane that protrudes outward from the tube portion and has a vane surface extending along an axis of the tube portion is provided on the portion of the tube portion of the doping device immersed in the melt adjacent to the through-hole, and the melt is blocked by the vane surface of the vane when the at least one of the doping device and the crucible is rotated to guide the melt into the interior of the tube portion through the through-hole.

When the crucible is rotated while fixing the doping device, the vane is preferably provided adjacent to a forward end of the through-hole in the rotary direction of the crucible.

When the doping device is rotated, the vane is preferably provided adjacent to a rear end of the through-hole in the rotary direction of the crucible.

According to the above arrangement, since the vane having the vane surface extending along the axis of the tube portion is provided at the portion of the tube portion of the doping device adjacent to the through-hole, the melt is blocked by the vane surface of the vane to be introduced to the interior of the tube portion through the through-hole when at least one of the tube portion of the doping device and the crucible containing the melt is rotated.

Since the melt to be in contact with the dopant gas can be stirred merely by rotating one of the tube portion of the doping device and the crucible containing the melt, the doping process can be facilitated.

An N-type silicon monocrystal according to still another aspect of the invention has a resistivity of 3 mΩ·cm or less, the N-type silicon monocrystal being manufactured by the dopant-injecting method according to one of the above aspects of the invention.

According to the above aspect of the invention, the above-described dopant-injecting method used for producing silicon monocrystal allows stable production of a low resistivity silicon monocrystal (N-type silicon monocrystal having resistivity of 3 mΩ·cm or below).

A doping device according to further aspect of the invention is used for injecting a volatile dopant into a semiconductor melt, the device including: an accommodating portion that accommodates a solid dopant; a blow-preventing member provided above the accommodating portion, the blow-preventing member preventing an inert gas flowing from above to below the accommodating portion from being directly blown to the accommodating portion; a cylindrical portion having openings on upper and lower end surfaces thereof, the opening on the upper end surface being in communication with the accommodating portion to guide a volatilized dopant gas to the melt; and a heat-shielding member at least covering a lower side of the accommodating portion to block a radiant heat from the melt to the accommodating portion.

When the melt is doped using the doping device of the above aspect of the invention, the volatile dopant may be injected into the melt while immersing the lower end of the cylindrical portion into the silicon melt. Alternatively, the dopant may be injected into the melt by blowing the volatilized dopant gas onto the melt with the lower end of the cylindrical portion being spaced apart from the silicon melt.

According to the above aspect of the invention, since the heat-shielding member that covers at least the lower side of the accommodating portion in which the dopant is accommodated to block the radiant heat from the melt to the accommodating portion is provided, the radiant heat of the melt is not easily transferred to the lower side of the accommodating portion. Accordingly, the volatilization rate of the dopant in the accommodating portion can be lowered as compared to the volatilization rate of a traditional doping device. Thus, the blowing pressure of the dopant gas to the melt can be lowered. Consequently, the silicon melt blown off by the gas can be reduced.

Accordingly, since it can be prevented that time allowance for dissolving the dopant into the melt is lost on account of excessively ejected dopant gas, the dopant can be sufficiently dissolved into the melt, so that absorption rate is not deteriorated. Further, it can be prevented that the formation of monocrystal is hindered by the blown-off silicon to make it difficult to manufacture semiconductor wafers having a desired resistance value.

The doping device of the above aspect of the invention is provided with the cylindrical portion having the opening on the upper end in communication with the accommodating portion to guide the volatilized dopant gas to the melt. Since the cylindrical portion is provided to form the path for guiding the volatilized dopant gas to the melt, the doping efficiency to the melt can be enhanced.

Inert gas such as argon gas is flowed in the pull-up device from above to below the accommodating portion. Since the doping device of the above aspect of the invention is provided with the blow-preventing member for preventing the gas from being directly blown to the accommodating portion, the temperature of the accommodating portion is not excessively cooled by the blown gas to become lower than an evaporation temperature of the dopant.

In the above aspect of the invention, it is preferable that an inner tube provided with the accommodating portion and the cylindrical portion; and an outer tube that accommodates the inner tube and has an opening on a lower end surface thereof, an upper portion opposite to the opening and a cylindrical lateral portion extending from a periphery of the upper portion toward the melt, where the upper portion of the outer tube provides the blow-preventing member, and the heat-shielding member is arranged to shield a space between the cylindrical portion of the inner tube and an inner circumference of the lateral portion of the outer tube.

According to the above arrangement, since the doping device includes the outer tube that accommodates the inner tube having the accommodating portion and the cylindrical portion, it can be assured that the inert gas such as argon gas is not directly blown to the inner tube.

In the above aspect of the invention, it is preferable that a lower end of the lateral portion of the outer tube protrudes toward the melt relative to a lower end of the cylindrical portion of the inner tube.

Since the lower end of the outer tube is protruded toward the melt relative to the lower end of the cylindrical portion of the inner tube, the doping process can be conducted while immersing only the lower end of the outer tube.

With this arrangement, even when a part of the gas ejected from the cylindrical portion of the inner tube is not dissolved into the melt, the gas resides within a space defined by the cylindrical portion of the inner tube, the outer tube and the heat-shielding member without being ejected outside the doping device, so that the doping efficiency can be enhanced.

Further, since only the lower end of the outer tube can be immersed in the melt without immersing the lower end of the cylindrical portion of the inner tube, the heat of the melt is not directly transferred to the inner tube. Accordingly, the temperature of the accommodating portion is not raised on account of direct transmission of the heat of the melt to the inner tube, so that increase in the volatilization rate of the dopant in the accommodating portion can be prevented.

In the above aspect of the invention, it is preferable that a path for re-introducing a part of the dopant gas blown from the lower end of the inner tube to the surface of the melt without being dissolved therein to the surface of the melt is provided between the cylindrical portion of the inner tube and the outer tube.

According to the above arrangement, since a path for re-introducing a part of the dopant gas blown from the lower end of the inner tube without touching the melt surface toward the surface of the melt is provided between the cylindrical portion of the inner tube and the outer tube, the doping efficiency can be enhanced.

In the above aspect of the invention, it is preferable that the heat-shielding member is provided with a plurality of heat-shielding plates that are arranged to shield a space between an outer circumference of the cylindrical portion of the inner tube and an inner circumference of the lateral portion of the outer tube, a first heat-shielding plate of the plurality of heat-shielding plates closest to the accommodating portion of the inner tube is made of opaque quartz, and a second heat-shielding plate closest to the melt is made of a graphite member.

According to the above arrangement, since the heat-shielding plate closest to the accommodating portion of the inner tube of the doping device is made of opaque quartz with high heat conductivity, the heat is not accumulated in the heat-shielding plate closest to the accommodating portion. Accordingly, since the accommodating portion is not heated by the heat accumulated in the heat-shielding plate, the volatilization rate of the dopant in the accommodating portion is not accelerated by the presence of the heat-shielding plate.

Further, since the heat-shielding plate closest to the melt is made of a material having relatively low heat conductivity such as graphite, the heat transmission from the melt can be blocked at a position remote from the accommodating portion, which also contributes to prevention of increase in the volatilization rate of the dopant in the accommodating portion.

A doping device according to still further aspect of the invention is used for injecting a volatilized dopant gas into a semiconductor melt, the device including: an accommodating portion that accommodates a solid dopant; a tube portion in which a gas ejected from the accommodating portion is introduced, the tube portion having an opening on a lower end surface, a lower end of the tube portion being immersed in the melt; and a through-hole provided on the tube portion at a portion immersed in the melt.

According to the above arrangement, since the through-hole is provided on the tube portion into which the gas ejected from the accommodating portion of the doping device is introduced, the melt is introduced into the interior of the tube portion or is ejected from the interior of the tube portion through the through-hole to be stirred when at least one of the doping device and the crucible containing the melt is driven. Accordingly, the melt inside the tube portion (i.e. the melt in contact with the gas) is exchanged by the stirring.

Consequently, it is facilitated for the gas in the tube portion to be dissolved in the melt, so that the doping efficiency can be enhanced.

In the above aspect of the invention, it is preferable that a vane that protrudes outward from the tube portion and has a vane surface extending along an axis of the tube portion, the vane being provided on the portion of the tube portion immersed in the melt adjacent to the through-hole.

According to the above arrangement, since the vane having the vane surface extending along the axis of the tube portion is provided at the portion of the tube portion of the doping device adjacent to the through-hole, the melt is blocked by the vane surface of the vane to be introduced to the interior of the tube portion through the through-hole when at least one of the tube portion of the doping device and the crucible containing the melt is rotated.

Since the melt to be in contact with the dopant gas can be stirred merely by rotating one of the tube portion of the doping device and the crucible containing the melt, the doping process can be facilitated.

In the above aspect of the invention, it is preferable that an inner tube including the accommodating portion and a cylindrical portion having an opening on upper and lower ends thereof, the accommodating portion being in communication with the upper end of the cylindrical portion to guide the volatilized dopant gas to the melt, the cylindrical portion not touching the melt, in which the tube portion is a cylindrical outer tube accommodating the inner tube and having a lower end protruding toward the melt relative to a lower end of the cylindrical portion.

With the above arrangement, since the lower end of the outer tube is protruded toward the melt relative to the lower end of the cylindrical portion of the inner tube, the doping process can be conducted while immersing only the lower end of the outer tube.

Since only the lower end of the outer tube can be immersed in the melt without immersing the lower end of the cylindrical portion of the inner tube, the heat of the melt is not directly transferred to the inner tube. Accordingly, the temperature of the accommodating portion is not raised on account of direct transmission of the heat of the melt to the inner tube, so that abrupt increase in the volatilization rate of the dopant accommodated in the accommodating portion can be prevented.

A pull-up device according to still further aspect of the invention includes: the doping device according to the above aspect of the invention; a crucible containing a melt; and a heat shielding shield covering a surface of the melt in the crucible and surrounding the doping device.

With the pull-up device, since the above-described doping device is provided, a semiconductor wafer having a desired resistance value can be produced.

1 ... pull-up device; 2, 2', 4, 5, 6, 7, 8 ... doping device; 21 ... outer tube (tube portion); 41, 51, 81 ... outer tube; 22, 72 ... inner tube; 23 ... heat-shielding member; 30 ... chamber; 31 ... crucible; 34 ... shield; 64 ... blow preventing plate (blow-preventing member); 211 ... upper portion (blow-preventing member); 212C ... through-hole; 213 ... vane; 221 ... accommodating portion; 222 ... cylindrical portion; 231, 231A, 231A1, 231A2, 231B, 231B1, 231B2, 231B3 ... heat-shielding plate (heat-shielding member); 412A ... through-hole; 422 ... cylindrical portion (tube); 422B1 ... through-hole

DETAILED DESCRIPTION

Embodiment(s) of the present invention will be described below with reference to the attached drawings.
First Embodiment A first exemplary embodiment will be described below with reference to FIGS. 1 and 2.

Figure 1:
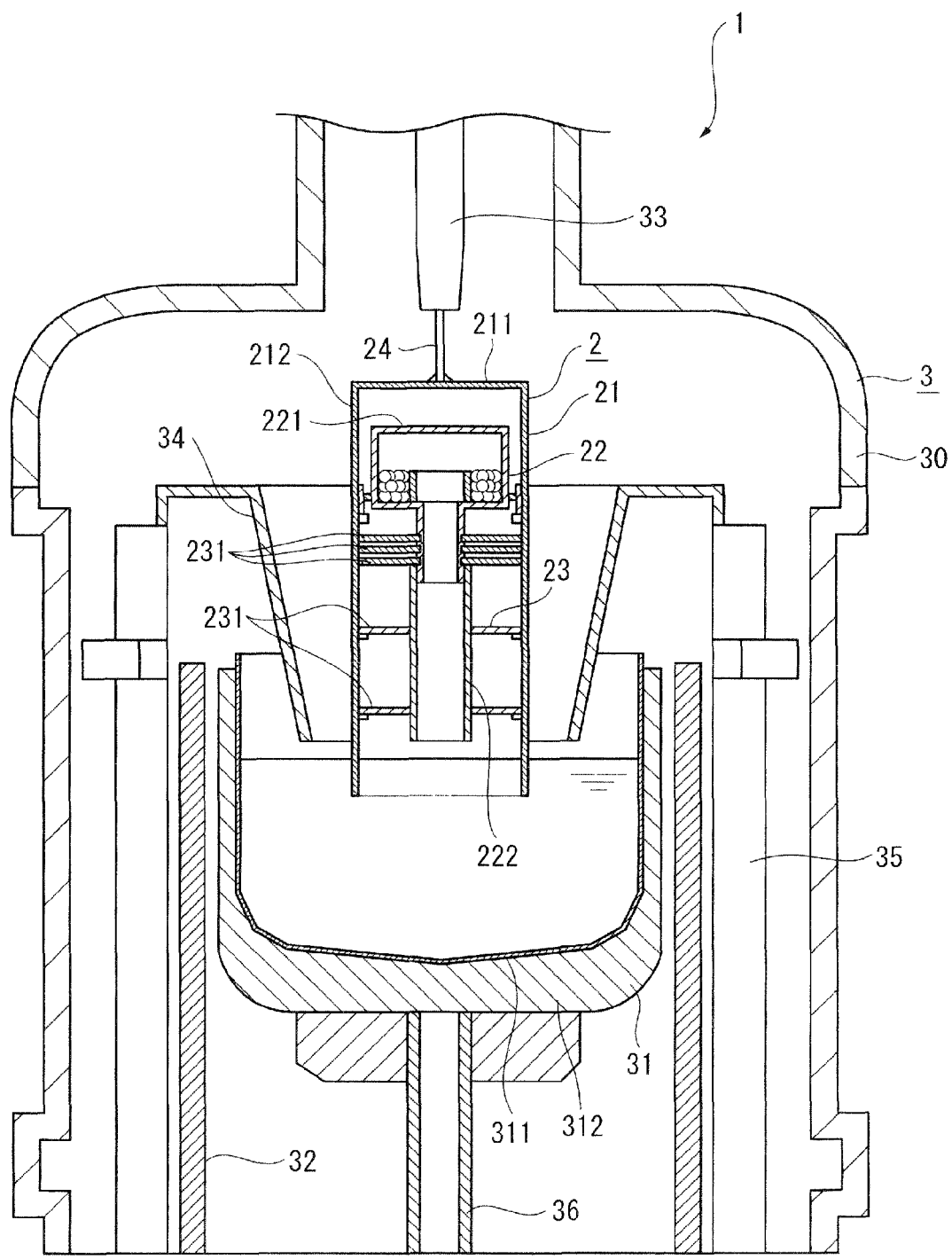
FIG. 1 is a cross-sectional view showing a pull-up device according to a first and fifth exemplary embodiments of the invention.
Figure 2:
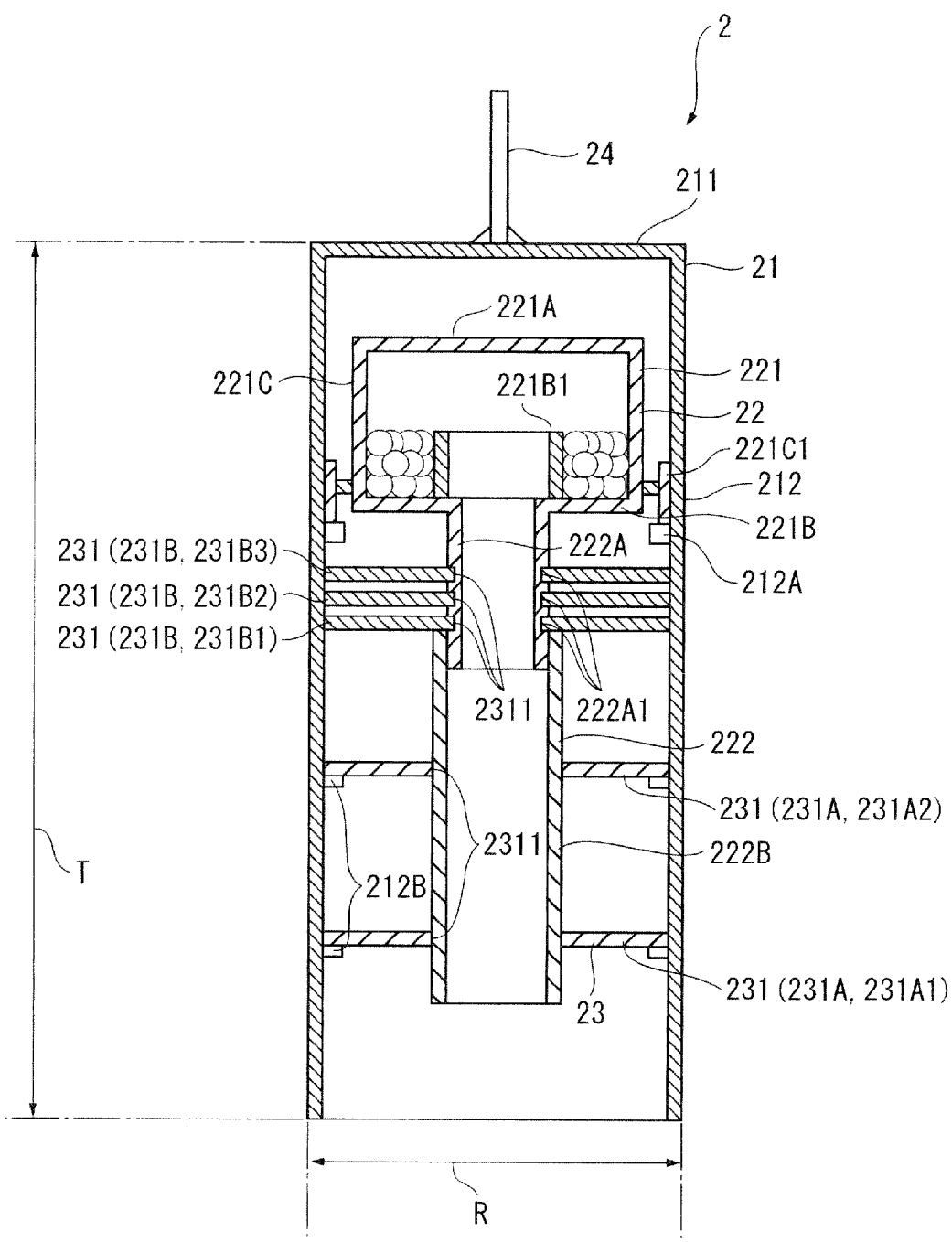
FIG. 2 is a cross-sectional view showing a doping device of the pull-up device.

FIG. 1 shows a pull-up device of the exemplary embodiment. FIG. 2 shows a cross-sectional view showing a doping device of the pull-up device.

The pull-up device 1 includes a pull-up device body 3 and a doping device 2.

The pull-up device body 3 includes a chamber 30, a crucible 31 disposed inside the chamber 30, a heater 32 for heating the crucible 31 by heat radiation, a pull-up portion 33, a shield 34 and a heat insulating cylinder 35.

Inert gas such as argon gas is injected into the chamber 30 from above to below. The inert gas is fed from a pulling-up chamber surrounded by the pull-up portion 33 on the upper side of the chamber 30. An entrance of chamber refers to a border area between the chamber 30 and the pulling-up chamber in the following description.

It should be noted that the pressure inside the chamber 30 is adjustable. During the doping process, the flow rate of the inert gas in the chamber 30 is set at 0.05 m/s or higher and 0.2 m/s or lower, and the pressure of the inert gas is set in a range from 5332 Pa (converted value of 40 Torr) to 79980 Pa (converted value of 600 Torr).

The crucible 31 melts semiconductor wafer material in the form of polycrystal silicon to prepare a silicon melt. The crucible 31 includes a bottomed cylindrical first crucible 311 made of quartz and a graphite second crucible 312 disposed outside the first crucible 311 to accommodate the first crucible 311. The crucible 31 is supported by a support shaft 36 rotated at a predetermined speed.

The heater 32, which is disposed outside the crucible 31, heats the crucible 31 so as to melt the silicon therein.

The pull-up portion 33, which is disposed above the crucible 31, is mounted with a seed crystal or the doping device 2. The pull-up portion 33 is rotatable.

The heat insulating cylinder 35 is disposed so as to surround the crucible 31 and the heater 32.

The shield 34 is a heat-blocking shield for blocking radiant heat radiated from the heater 32 toward the doping device 2. The shield 34 surrounds the doping device 2 and covers a surface of the melt. The shield 34 is configured as a truncated cone having smaller opening at a lower side than an opening on an upper side.

The doping device 2 is a device for volatilizing a solid dopant and doping the volatilized dopant on the silicon melt in the crucible 31.

The dopant may be, for instance, red phosphorus, arsenic and the like.

The doping device 2 includes an outer tube 21, an inner tube 22 disposed inside the outer tube 21 and a heat-shielding member 23.

The outer tube 21, which is cylindrical with its lower end being opened while its upper end being closed, includes an upper portion 211 for providing an upper end surface and a lateral portion 212 that extends downwardly from an outer periphery of the upper portion 211. In the exemplary embodiment, the lateral portion 212 of the outer tube 21 is configured as a cylinder. The material of the outer tube 21 is, for instance, transparent quartz.

A height T of the outer tube 21 is, for instance, 450 mm. A diameter R of the lateral portion 212 of the outer tube 21 is preferably 100 mm or more and 1.3 times as large as a pulling-up crystal diameter or smaller, which is 150 mm for instance.

The upper portion 211 of the outer tube 21 is provided with a support 24 that protrudes upwardly from the upper portion 211. By mounting the support 24 on the pull-up portion 33 of the pull-up device 1, the outer tube 21 is held by the pull-up device 1.

The upper portion 211 of the outer tube 21 covers a later-described accommodating portion 221 of the inner tube 22 from the above. The upper portion 211 serves as a blow prevention member for preventing the above-mentioned inert gas that flows from top to bottom inside the chamber 30 (in other words, from top to bottom of the accommodating portion 221) from being directly blown against the accommodating portion 221.

The inner tube 22 includes an accommodating portion 221 and a cylindrical portion 222 connected to the accommodating portion 221 to be in communication therewith.

The material of the inner tube 22 is, for instance, transparent quartz.

The accommodating portion 221, which accommodates solid dopant, is a hollow columnar portion. The accommodating portion 221 includes a substantially plane-circular upper portion 221A, a bottom portion 221B disposed to face the upper portion 221A, a lateral portion 221C disposed between outer peripheries of the upper portion 221A and the bottom portion 221B.

The center of the bottom portion 221B is provided with an opening. Solid dopant is placed on the bottom portion 221B around the opening. When the solid dopant is volatilized, the dopant gas is ejected through the opening. A circumference of the opening is provided with a drop preventing wall 221B1 for preventing the solid dopant from being dropped.

The position of the dopant housed in the accommodating portion 221 is, for instance, 300 mm or more above the melt surface.

The lateral portion 221C is provided with a support piece(s) 221C1 that is substantially T-shaped in cross section, the support piece(s) 221C1 protruding outwardly from the accommodating portion 221. By placing the support piece(s) 221C1 on a support(s) 212A formed on an inner circumference of the outer tube 21, the inner tube 22 is supported by the outer tube 21.

The cylindrical portion 222 is a cylindrical member having open upper and lower end surfaces. An upper end of the cylindrical portion 222 is connected to the opening on the bottom portion 221B of the accommodating portion 221.

A diameter of the cylindrical portion 222 is smaller than that of the outer tube 21, so that a gap is formed between an outer circumference of the cylindrical portion 222 and an inner circumference of the outer tube 21.

In the present embodiment, the cylindrical portion 222 includes a first cylindrical portion 222A connected to the opening of the accommodating portion 221 and a second cylindrical portion 222B connected to the first cylindrical portion 222A to extend downwardly therefrom.

The first cylindrical portion 222A is integrated with the accommodating portion 221 while being provided as a body independent of the second cylindrical portion 222B.

The first cylindrical portion 222A is provided with a plurality of ring-shaped grooves 222A1 formed along a circumferential direction of the first cylindrical portion 222A. In the present embodiment, three grooves 222A1 are formed. The grooves 222A1 serve to support later-described heat-shielding plates 231 of the heat-shielding member 23.

The second cylindrical portion 222B has a diameter of 20 mm or more and 150 mm or less. Since the second cylindrical portion 222B in the present embodiment is a cylindrical member, its opening for ejecting the dopant gas also has a diameter in the range from 20 mm to 150 mm. When the outer tube 21 holds the inner tube 22, a lower distal end of the outer tube 21 protrudes further downward (toward the melt) than a lower distal end of the second cylindrical portion 222B.

The heat-shielding member 23 covers the lower side of the accommodating portion 221 to block the radiant heat from the melt. The heat-shielding member 23 has a plurality (exemplarily, five) of substantially plane-circular heat-shielding plates 231.

The number of the heat-shielding plates 231 may be determined in any suitable manner so that the flow volume of the dopant gas blown onto the melt becomes 3 to 15 litters/min. The flow volume of the gas flowing out of the lower end of the cylindrical portion 222 is larger than the flow volume of the dopant gas evaporating from the melt.

It is preferable that the number and the position of the heat-shielding plates 231 are set so that the sublimation rate of the dopant accommodated in the accommodating portion 221 becomes 10 to 50 g/min.

The outer diameter of the heat-shielding plates 231 is substantially equal to the inner diameter of the outer tube 21. The centers of the heat-shielding plates 231 are provided with holes 2311 into which the cylindrical portion 222 is inserted. The heat-shielding plates 231 are substantially horizontally disposed to shield the gap between the cylindrical portion 222 of the inner tube 22 and the outer tube 21 and to be substantially parallel to one another.

In the exemplary embodiment, two heat-shielding plates 231A of the five heat-shielding plates 231 near the melt are provided by graphite members, whereas three heat-shielding plates 231B on the side of the accommodating portion 221 are provided by quartz members.

The plurality of heat-shielding plates 231 are disposed in the order of the two heat-shielding plates 231A and the three heat-shielding plates 231B from the lower end of the cylindrical portion 222.

The heat-shielding plates 231A are supported by the outer tube 21 such that projections 212B formed on inner sides of the outer tube 21 support the outer peripheries of the heat-shielding plates 231A. A heat-shielding plate 231A (231A1) that is the closest to the melt is disposed, for example, approximately 80 mm above the lower distal end of the cylindrical portion 222.

A heat-shielding plate 231A2 above the heat-shielding plate 231A1 is disposed, for example, approximately 170 mm above the lower distal end of the cylindrical portion 222. Hence, a gap of approximately 90 mm is formed between the heat-shielding plate 231A1 and the heat-shielding plate 231A2.

On the other hand, the heat-shielding plates 231B are supported by the inner tube 22 such that the peripheries of the holes 2311 are supported by the grooves 222A1 of the first cylindrical portion 222A of the cylindrical portion 222 of the inner tube 22.

Among the three heat-shielding plates 231B, a heat-shielding plate 231B1 that is the closest to the melt is disposed, for example, approximately 250 mm above the lower distal end of the cylindrical portion 222.

A heat-shielding plate 231B2 above the heat-shielding plate 231B1 is disposed, for example, approximately 10 mm above the heat-shielding plate 231B1.

A heat-shielding plate 231B3 further above the heat-shielding plate 231B1 is disposed, for example, approximately 10 mm above the heat-shielding plate 231B2. In other words, gaps of a predetermined size are formed between the heat-shielding plates 231B.

The distance between the heat-shielding plate 231B1 and the accommodating portion 221 is exemplarily 30 mm.

Thus arranged doping device 2 is assembled as follows.

Initially, solid dopant is inserted into the accommodating portion 221 of the inner tube 22.

Next, the heat-shielding plate 231B is attached to the first cylindrical portion 222A of the cylindrical portion 222 integrated with the accommodating portion 221. Specifically, the first cylindrical portion 222A is inserted to the central hole 2311 of the respective heat-shielding plates 231B and the peripheries of the holes 2311 of the heat-shielding plates 231B are engaged with the respective grooves 222A1 of the first cylindrical portion 222A.

Subsequently, the first cylindrical portion 222A and the heat-shielding plates 231B are inserted into the outer tube 21 and the support piece 221C of the accommodating portion 221 is placed on the support 212A provided on the outer tube 21.

Next, the heat-shielding plates 231A are inserted into the outer tube 21 and the outer circumference of the heat-shielding plates 231A is supported by the projections 212B of the outer tube 21.

Finally, the second cylindrical portion 222B of the cylindrical portion 222 of the inner tube 22 is inserted into the outer tube 21. Specifically, the second cylindrical portion 222B is inserted into the holes 2311 provided at the center of the heat-shielding plates 231A supported by the outer tube 21. Then, the upper end of the second cylindrical portion 222B and the lower end of the first cylindrical portion 222A are connected.

The doping device 2 is assembled as described above.

When using the assembled doping device 2, the support 24 provided on the outer tube 21 of the doping device 2 is attached to the pull-up portion 33 of the pull-up device 1.

Inert gas is subsequently flowed from above the pull-up device 1 toward the melt. The inert gas flows along the surface of the melt.

The inert gas is continuously flowed during conducting the doping and pulling up a grown crystal. The flow volume of the inert gas is in a range from 50 litters/min to 400 litters/min. The flow rate of the inert gas at the entrance of the chamber 30 is in a range from 0.05 m/s to 0.2 m/s. When the flow volume of the inert gas is set to exceed 400 litters/min, the accommodating portion 221 may be so cooled that the dopant is not volatilized or the sublimated dopant may be solidified and adhered.

Next, the lower end of the outer tube 21 is immersed in the melt. At this time, the lower end of the cylindrical portion 222 of the inner tube 22 is set so as not to touch the melt.

The dopant placed inside the accommodating portion 221 of the doping device 2 is gradually sublimated by the heat from the melt, such that the dopant in a gas form is ejected from the cylindrical portion 222 of the doping device 2 to be dissolved in the melt.

A temperature of the melt in the crucible 31 at the time of doping is in a range from a melting point of a material of the melt to 60° C. above the melting point. In the present embodiment, since the material of the melt is silicon, the temperature of the melt is set to be in a range from 1412° C. to 1472° C.

When the gas is dissolved in the melt, the pull-up portion 33 of the pull-up device 1 is detached from the doping device 2 and mounted with the seed crystal. Then, the pulling-up of the grown crystal is started.

According to the present embodiment, the following effects can be obtained.

(1-1) The shield 34 is provided on the pull-up device 1 so that the shield 34 surrounds the doping device 2 to cover the melt surface. In addition, the doping device 2 includes the heat-shielding plate 231 that shields transmission of heat ray from the melt. The heat-shielding plate 231 is disposed to cover a lower side of the accommodating portion 221 that accommodates the dopant.

Accordingly, the shield 34 and the heat-shielding plate 231 reliably prevent the transfer of the radiant heat of the melt to the accommodating portion 221, so that the sublimation rate of the dopant within the accommodating portion 221 becomes 10 g/min or higher and 50 g/min or lower, which is slower than the sublimation rate in a traditional doping device.

Thus, the dopant is not instantaneously volatilized and the blowing pressure of the dopant gas to the melt can be lowered.

Further, since it can be prevented that time allowance for dissolving the dopant into the melt is lost on account of excessively ejected dopant gas, the dopant can be sufficiently dissolved into the melt, so that absorption rate is not deteriorated. Further, it can be prevented that the formation of monocrystal is hindered by the blown-off silicon to make it difficult to manufacture semiconductor wafers having a desired resistance value.

(1-2) In this exemplary embodiment, the temperature of the melt when being doped is set at the melting point of silicon or higher and 60° C. above the melting point or lower.

When the temperature of the melt is lower than the melting point of silicon, in the event that the melt temperature is low during the doping process, the surface of the melt may be solidified as a result of lowered silicon temperature when the doping tube is immersed or the gas is blown, so that the gas is not easily absorbed.

On the other hand, when the melt temperature exceeds the point 60° C. above the melting point, the melt may be boiled. Further, when the melt temperature exceeds the point 60° C. above the melting point, evaporation of the dopant gas absorbed in the melt may be promoted to lower the dopant absorption efficiency.

Since the temperature of the melt is set at the melting point of silicon or higher and 60° C. above the melting point or lower in this exemplary embodiment, the above problems can be avoided.

(1-3) When the pressure inside the chamber 30 is less than 5332 Pa (converted value of 40 Torr) during the doping process, the dopant dissolved in the melt may be easily volatilized.

On the other hand, when the pressure inside the chamber 30 exceeds 79980 Pa (converted value of 600 Torr), though volatilization of the dopant from the melt can be restrained, high pressure resistance and heat resistance are required for the chamber 30, which incurs additional production cost.

In the exemplary embodiment, since the pressure inside the chamber 30 when being doped is set within the above range, the above problem can be avoided.

(1-4) The flow volume of the inert gas flowing from above to below the accommodating portion 221 of the doping device 2 is set in a range from 50 litters/min to 400 litters/min and the flow rate at the entrance of the chamber 30 is set in a range from 0.05 m/s to 0.2 m/s. Accordingly, the accommodating portion 221 can be cooled by the inert gas, thus allowing adjustment of the sublimation rate of the dopant in the accommodating portion 221.

(1-5) Since the diameter of the ejecting opening of the gas on the second cylindrical portion 222B of the inner tube 22 is 20 mm or more, the volatilized dopant gas is not vigorously blown onto the melt, so that blow-off of the melt can be reliably avoided.

(1-6) If the position of the dopant is located very close to the surface of the melt when being doped, the dopant is disposed in a high temperature atmosphere due to the heat of the melt, so that it may become difficult to control the sublimation rate of the dopant.

In this exemplary embodiment, since the position of the dopant is located 300 mm or more above the surface of the melt, the sublimation rate of the dopant can be reliably controlled.

(1-7) The doping device 2 is provided with the cylindrical portion 222 having an upper end in communication with the accommodating portion 221 to guide the volatilized dopant gas to the melt. Since the cylindrical portion 222 is provided, the volatilized dopant gas can be reliably guided to the melt, so that the doping efficiency to the melt can be enhanced.

(1-8) Further, the doping device 2 of the exemplary embodiment includes the cylindrical outer tube 21 that has an opening on the lower end surface and accommodates the inner tube 22 having the accommodating portion 221 and the cylindrical portion 222. When the inert gas is flowed from the upper side of the melt to the surface of the melt in doping the melt, since the doping device 2 includes the outer tube 21 that houses the inner tube 22, the inert gas is not directly blown to the inner tube 22. Accordingly, it can be avoided that the inner tube 22 is cooled by the inert gas to be lower than the evaporation temperature of the dopant.

(1-9) In this exemplary embodiment, the lower end of the outer tube 21 of the doping device 2 is projected toward the melt relative to the lower end of the cylindrical portion 222 of the inner tube 22 so that only the lower end of the outer tube 21 is immersed in the melt to dope the melt.

Accordingly, even when a part of the gas ejected from the cylindrical portion 222 of the inner tube 22 is not dissolved into the melt, the gas resides within a space defined by the cylindrical portion 222 of the inner tube 22, the outer tube 21 and the heat-shielding plate 231 without being ejected outside the doping device 2, so that the doping efficiency can be enhanced.

(1-10) When the melt is doped, only the lower end of the outer tube 21 is immersed in the melt without immersing the lower end of the cylindrical portion 222 of the inner tube 22, the heat of the melt is not directly transferred to the inner tube 22. Accordingly, the temperature of the accommodating portion 221 is not raised on account of the heat of the melt directly transferred to the inner tube 22. Thus, the sublimation rate of the dopant in the accommodating portion 221 is not increased.

(1-11) In this exemplary embodiment, the plurality of heat-shielding plates 231 disposed between the outer tube 21 and the inner tube 22 and covering the lower side of the accommodating portion 221 of the inner tube 22 are provided. Accordingly, the heat ray from the melt can be reliably shielded and the sublimation rate of the dopant in the accommodating portion 221 can be lowered.

(1-12) Since the heat conductivity of the heat-shielding plate 231 (231B) closest to the accommodating portion 221 of the inner tube 22 of the doping device 2 is relatively high, the heat is not accumulated in the heat-shielding plate 231B closest to the accommodating portion 221. Accordingly, since the accommodating portion 221 is not heated by the heat accumulated in the heat-shielding plate 231B, the sublimation rate of the dopant in the accommodating portion 221 is not accelerated by the presence of the heat-shielding plate 231B.

Further, since the heat conductivity of the heat-shielding plate 231A closest to the melt is relatively low, the heat transmission from the melt can be blocked at a position remote from the accommodating portion 221, which also contributes to prevention of increase in the sublimation rate of the dopant in the accommodating portion 221.

(1-13) Since the plurality of heat-shielding plates 231 are spaced apart by a predetermined gap, the heat is not easily accumulated in the respective heat-shielding plates 231 as compared with an arrangement in which the heat-shielding plates are superposed.

Second Embodiment

Next, a second exemplary embodiment of the invention will be described below. In the following description, the same components as those having been explained above will be referenced with the same numeral to omit the description thereof.

Figure 3:
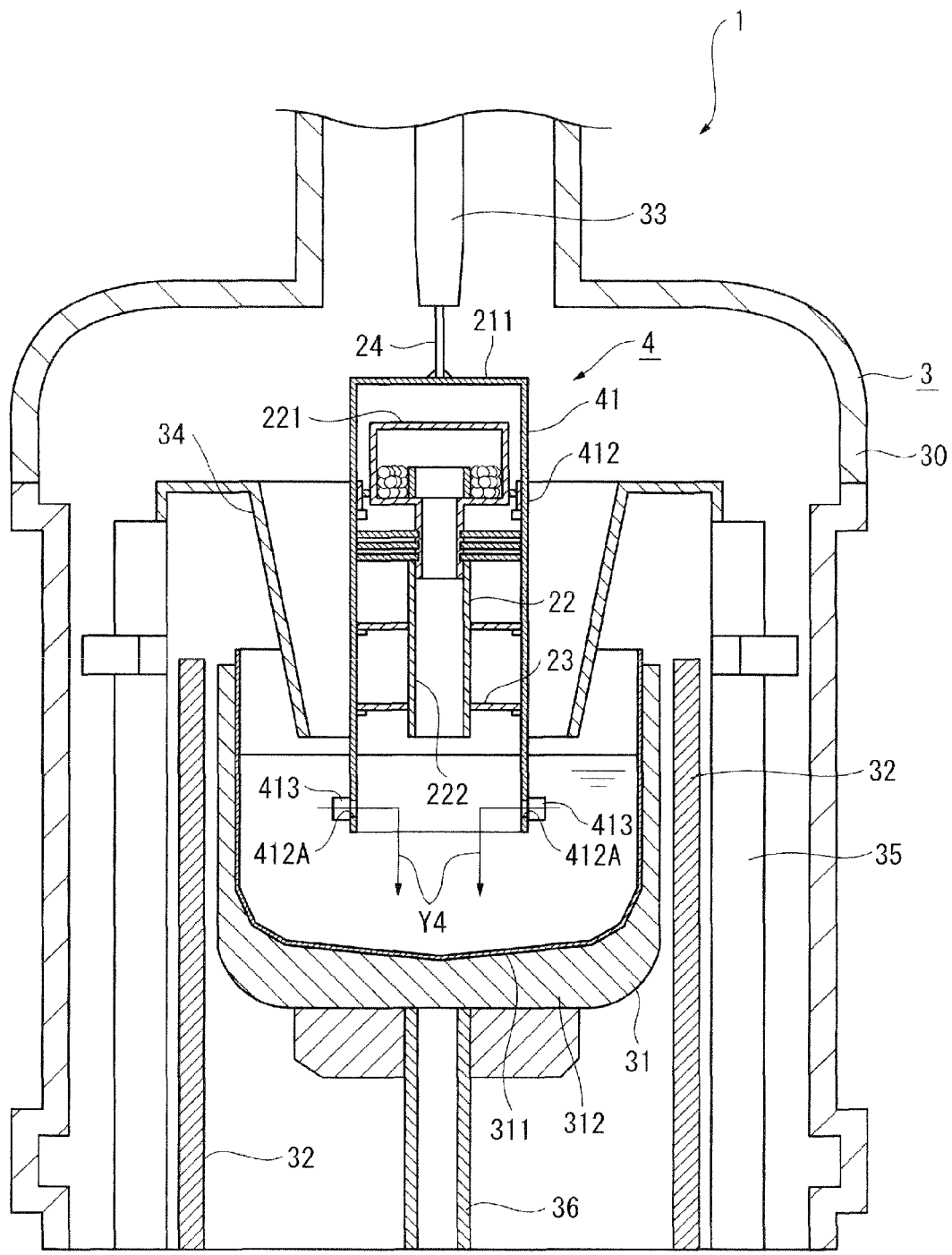
FIG. 3 is a cross-sectional view showing a pull-up device according to a second exemplary embodiment of the invention.
Figure 4:
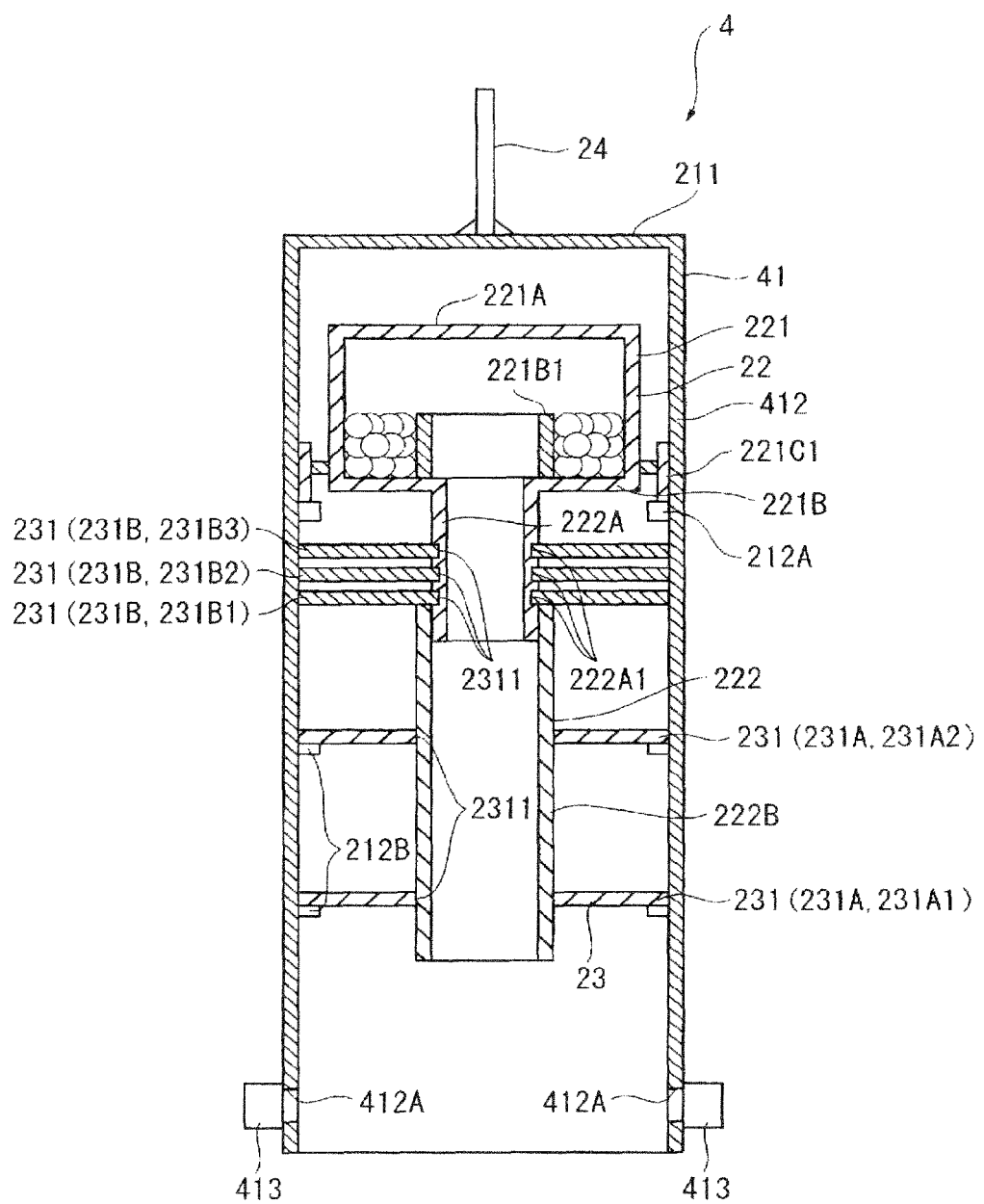
FIG. 4 is a cross-sectional view showing a doping device of the second exemplary embodiment.

As shown in FIGS. 3 and 4, the doping device 4 of this exemplary embodiment includes the same inner tube 22 as that of the first exemplary embodiment and an outer tube 41 that surrounds the inner tube 22. In other words, the only difference between the doping device 4 of this exemplary embodiment and the doping device 2 of the first exemplary embodiment is the structure of the outer tube.

The outer tube 41, which is bottomed-cylindrical with its lower end being opened while its upper end being closed, includes an upper portion 211 and a lateral portion 412 that extends downwardly from an outer periphery of the upper portion 211. In the exemplary embodiment, the lateral portion 412 of the outer tube 41 is configured as a cylinder. The material of the outer tube 41 is, for instance, transparent quartz as in the first exemplary embodiment. The height and diameter of the outer tube 41 are the same as the outer tube 21 of the first exemplary embodiment.

The lateral portion 412 protrudes toward the melt relative to the lower end of the cylindrical portion 222 of the inner tube 22 so that the lower end of the lateral portion 412 is immersed in the melt.

A plurality of through-holes 412A are provided on the lower end (the portion immersed in the melt) of the lateral portion 412 at a regular interval along the circumference thereof.

Further, a plurality of vanes 413 are provided on the outer circumference of the lateral portion 412 adjacent to the through-holes 412A.

The vanes 413 are arranged so that vane surfaces thereof are aligned with the axis of the outer tube 41 of the doping device 4. Further, though described later in detail, the doping device 4 is rotated around the central axis of the outer tube 41 when the melt is doped, where the vanes 413 are provided rearward relative to the rotary direction of the outer tube 41 (see FIG. 5).

In this exemplary embodiment, the doping device 4 is used to dope the melt as follows. Incidentally, the pressure in the chamber 30, the flow volume and flow rate of the inert gas, the temperature of the melt, the position of the dopant from the melt surface and the sublimation rate of the dopant gas blown onto the melt when the doping process is conducted are the same as those in the first exemplary embodiment.

Initially, while rotating the crucible 31 in advance, the lower end of the outer tube 41 is immersed in the melt. At this time, the lower end of the cylindrical portion 222 of the inner tube 22 is set so as not to touch the melt.

Figure 5:
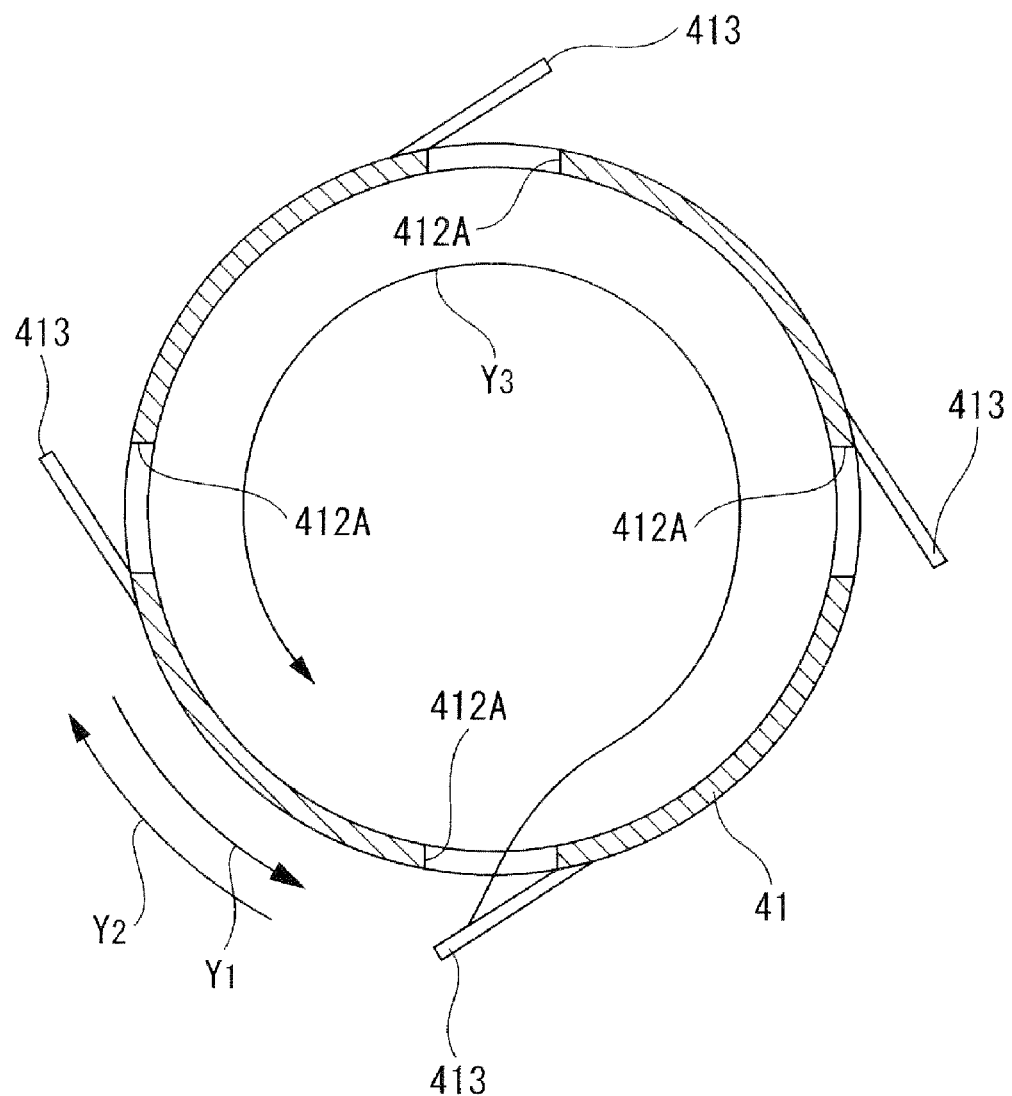
FIG. 5 is a schematic view showing a doping process using the doping device of the second exemplary embodiment.

Further, as shown in FIG. 5, the doping device 4 is rotated around the central axis of the outer tube 41 in a direction opposite to the rotary direction of the crucible 31. In FIG. 5, an arrow Y1 indicates the rotary direction of the crucible 31, whereas an arrow Y2 indicates the rotary direction of the doping device 4.

The dopant placed inside the accommodating portion 221 of the doping device 4 is gradually sublimated by the heat from the melt, such that the dopant in a gas form is ejected from the cylindrical portion 222 of the doping device 2.

By rotating the doping device 4 and the crucible 31, the melt outside the outer tube 41 collides with the vane 413 provided on the outer tube 41 to be introduced to the interior of the outer tube 41 through the through-hole 412A as shown in an arrow Y3 in FIG. 5. The melt inside the outer tube 41 is gradually ejected from the lower side of the outer tube 41 to form a flow in a direction of an arrow Y4 shown in FIG. 3. In other words, the melt surface on which the gas ejected from the cylindrical portion 222 of the inner tube 22 is stirred, so that the gas is always blown on a new melt surface. Further, the melt in which the gas is dissolved is ejected from the opening on the lower end of the outer tube 41.

According to this exemplary embodiment, as well as the effects (1-1) to (1-13) of the first exemplary embodiment, following effects can be obtained.

(2-1) The doping device 4 is provided with the outer tube 41 having the through-hole 412A at the portion immersed in the melt. Further, the doping device 4 and the crucible 31 are reversely rotated with each other when the melt is doped. By rotating the doping device 4 and the crucible 31, the melt outside the outer tube 41 collides with the vane 413 provided on the outer tube 41 to be introduced to the interior of the outer tube 41 through the through-hole 412A to be subjected to the blow of the dopant gas. Then, the melt having been subjected to the blow of the gas is gradually discharged from the opening on the lower end of the outer tube 41.

Since the new melt is always introduced to the portion within the outer tube 41 at which the gas is blown from the inner tube 22, the absorption efficiency of the dopant gas can be enhanced.

(2-2) Further, since the melt in which the dopant gas is dissolved is discharged from the opening on the lower end of the outer tube 41, the gas containing the dopant no more exists on the surface of the melt, so that the evaporation of the dopant from the melt can be restrained, thus further enhancing the doping efficiency.

Third Embodiment

Figure 6:
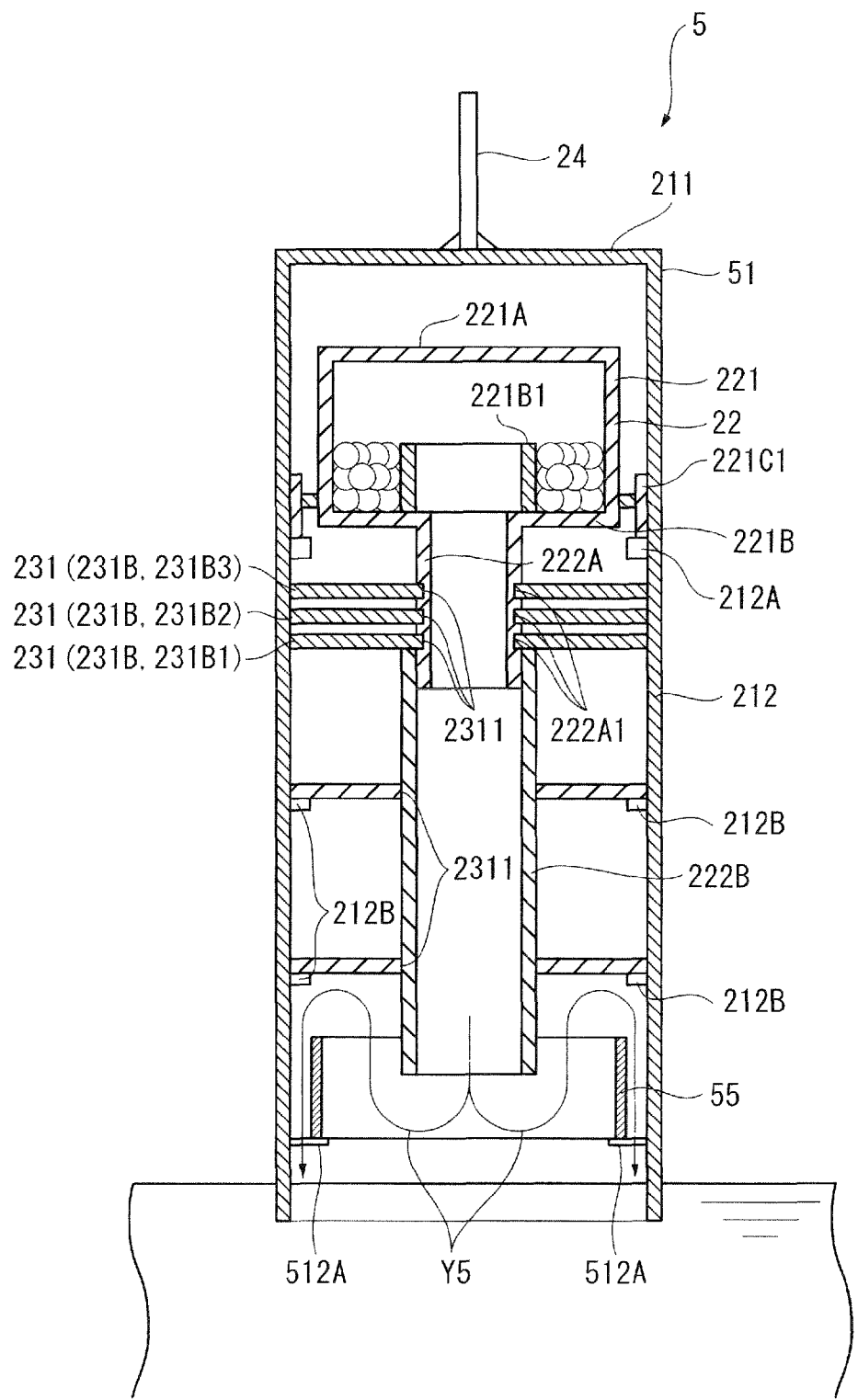
FIG. 6 is a cross-sectional view showing a doping device of a third exemplary embodiment of the invention.

Next, a third exemplary embodiment will be described below with reference to FIG. 6.

A doping device 5 of this exemplary embodiment has the same inner tube 22, support 24 and heat-shielding member 23 as the first exemplary embodiment, an outer tube 51 and a tube 55 disposed between the outer tube 51 and the inner tube 22.

The outer tube 51 has approximately the same structure as the outer tube 21 of the first exemplary embodiment except that a plurality of projections 512A extending toward the inside of the outer tube 51 are provided on an inside of the lower end of the outer tube 51. The other arrangement of the outer tube 51 is the same as the outer tube 21 of the first exemplary embodiment.

The tube 55 has open upper and lower end surfaces and has a diameter smaller than the outer tube 51 and greater than the cylindrical portion 222 of the inner tube 22. The tube 55 is disposed on the projections 512A and is located between the outer tube 51 and the inner tube 22. A gap is provided between the inner circumference of the lateral portion 212 of the outer tube 51 and the outer circumference of the tube 55. A gap is also provided between the inner circumference of the tube 55 and the cylindrical portion 222 of the inner tube 22.

The height of the tube 55 is smaller than a distance from the lower end of the outer tube 51 to the heat-shielding plate 231A (231A1) closest to the melt, so that a gap is provided between the tube 55 and the heat-shielding plate 231A (231A1).

In this exemplary embodiment, the doping device 5 is used to dope the melt as follows. Incidentally, the pressure in the chamber 30, the flow volume and flow rate of the inert gas, the temperature of the melt, the position of the dopant from the melt surface and the sublimation rate of the dopant gas blown onto the melt when the doping process is conducted are the same as those in the above embodiments.

While rotating the crucible 31 in advance, the lower end of the outer tube 51 is immersed in the melt. At this time, the lower end of the cylindrical portion 222 of the inner tube 22 and the lower end of the tube 55 are set so as not to touch the melt.

The dopant placed inside the accommodating portion 221 of the doping device 5 is gradually sublimated by the heat from the melt, such that the dopant in a gas form is ejected from the cylindrical portion 222 of the doping device 5 to be dissolved in the melt.

At this time, a part of the gas ejected from the cylindrical portion 222 escapes to the outside of the cylindrical portion 222 without being dissolved in the melt. Further, a part of the gas is reflected on the surface of the melt without being dissolved in the melt. The part of gas passes through the gap between the outer circumference of the lower end of the cylindrical portion 222 and the inner circumference of the tube 55 to go up, and subsequently is reflected by the heat-shielding plate 231 to be introduced between the cylindrical portion 222 and the outer circumference of the lateral portion 212 of the tube 55. Then, the gas is introduced to the melt surface (see arrow Y5 in FIG. 6).

In other words, the gap between the outer circumference of the lower end of the cylindrical portion 222 and the inner circumference of the tube 55 and the gap between the inner circumference of the outer tube 51 and the outer circumference of the tube 55 define a path for introducing the gas to the melt surface.

According to this exemplary embodiment, as well as the effects (1-1) to (1-13) of the first exemplary embodiment, following effects can be obtained.

(3-1) The doping device 5 includes the tube 55 disposed between the outer tube 51 and the inner tube 22. A part of the gas ejected from the cylindrical portion 222 and not dissolved in the melt passes through the gap between the outer circumference of the lower end of the cylindrical portion 222 and the inner circumference of the tube 55, goes up and subsequently is reflected by the heat-shielding plate 231 to be introduced to the space between the inner circumference of the outer tube 51 and the outer circumference of the tube 55. Then, the gas is re-introduced to the melt surface. Since the gas not dissolved in the melt can be introduced to the melt surface again, the doping efficiency can be enhanced.

Modification(s) of First to Third Embodiments

The present invention is not limited to the above-described embodiments but may include modifications and improvements made within a scope where an object of the present invention can be achieved.

Figure 7:
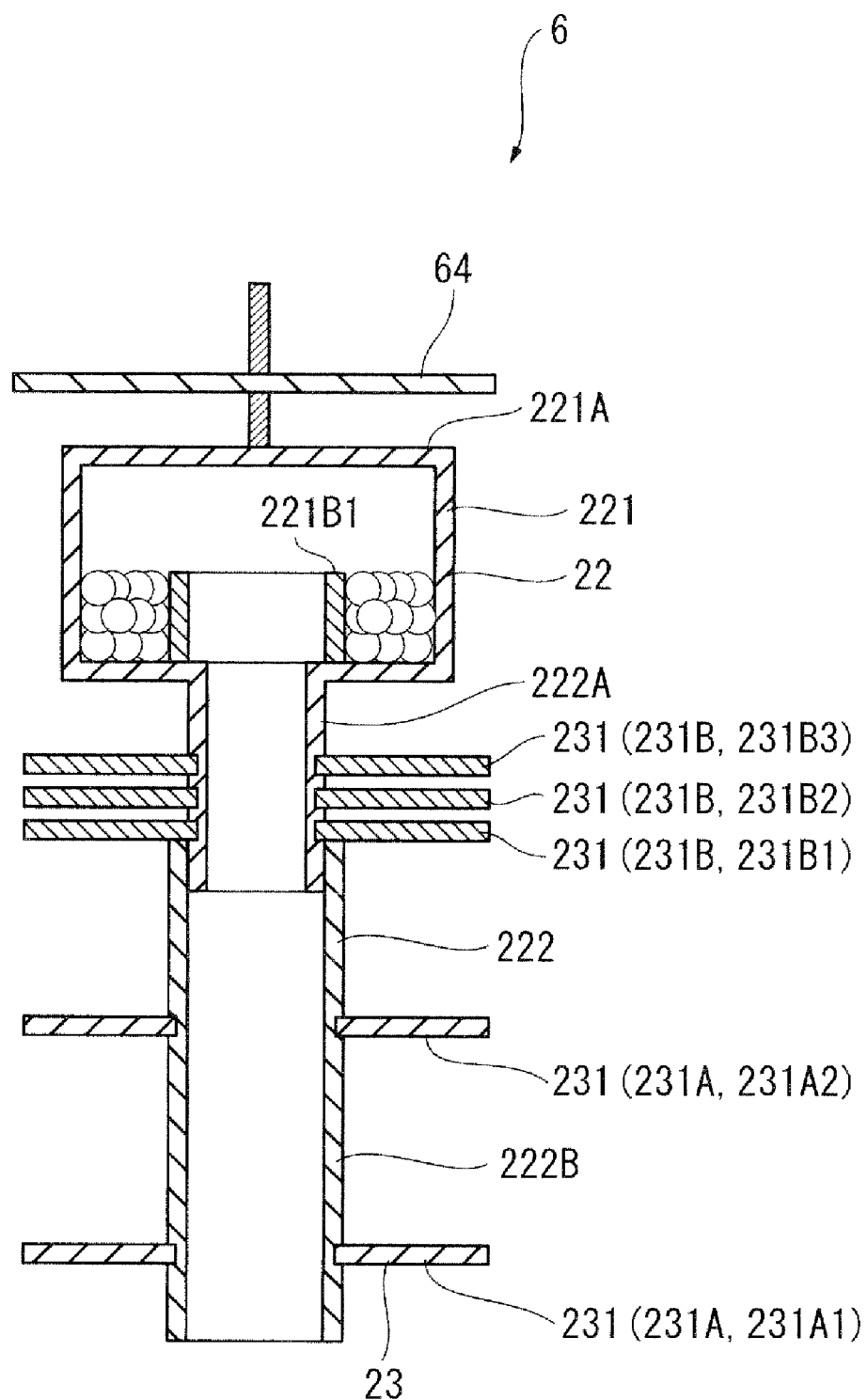
FIG. 7 is a cross-sectional view showing a doping device according to a modification of the first to third exemplary embodiments and the fifth exemplary embodiment.

For instance, though the doping devices 2, 4, 5 of the exemplary embodiments include the outer tubes 21, 41, 51, the outer tube may not be provided. For instance, as shown in FIG. 7, a blow-preventing plate 64 for preventing a blow of the gas to the accommodating portion 221 of the inner tube 22 may be provided above the accommodating portion 221 in place of the outer tube. When the doping device 6 having no outer tube is used, all of the heat-shielding plates 231 are preferably fixed on the inner tube 22.

Figure 8:
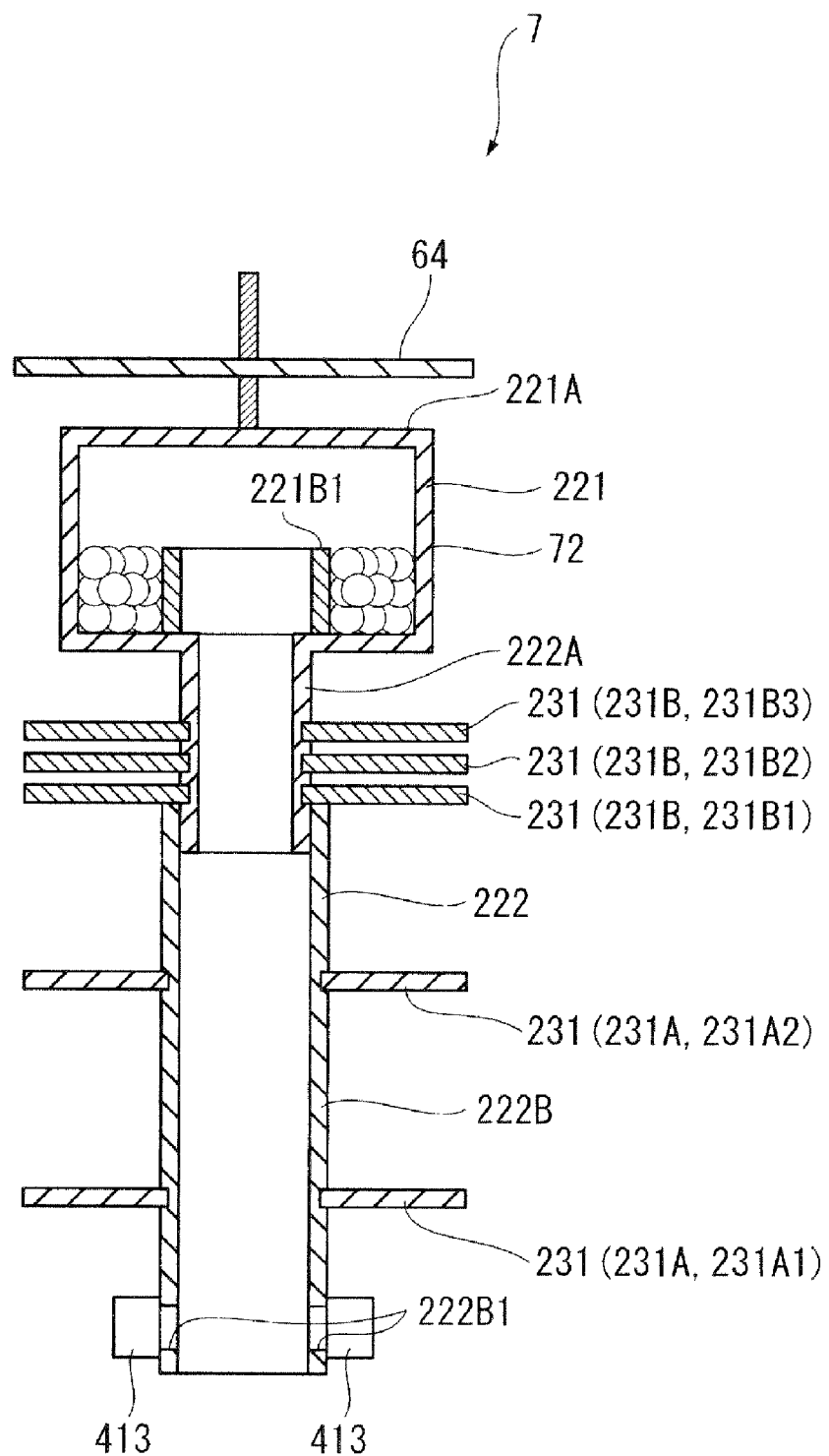
FIG. 8 is a cross-sectional view showing a doping device according to another modification of the first to third exemplary embodiments.

As shown in FIG. 8, when the melt is to be stirred in a doping device 7 having no outer tube, through-holes 222B1 may be provided on the inner tube 72 and vanes 413 may be provided adjacent to the through-holes 222B1. The inner tube 72 is the same as the inner tube 22 of the first exemplary embodiment except for the provision of the through-holes 222B1 and the vanes 413.

Though the lower end of the outer tubes 21, 41, 51 of the doping devices 2, 4, 5 protrude relative to the lower end of the inner tube 22 in the respective exemplary embodiments, the lower end of the inner tube 22 and the lower end of the outer tube may be situated at the same level relative to the melt.

Though the doping devices 2, 4, 5 of the respective exemplary embodiments include the heat-shielding plates 231 covering the lower side of the accommodating portion 221 of the inner tube 22, the doping device may alternatively be provided with a heat-shielding member covering the lateral portion 221C as well as the lower side of the accommodating portion 221. For instance, a heat-insulating material may be wound on the lateral portion 221C and the bottom portion 221B of the accommodating portion 221. With this arrangement, the transmission of the radiant heat from the melt to the accommodating portion 221 can be further reliably prevented.

Figure 9:
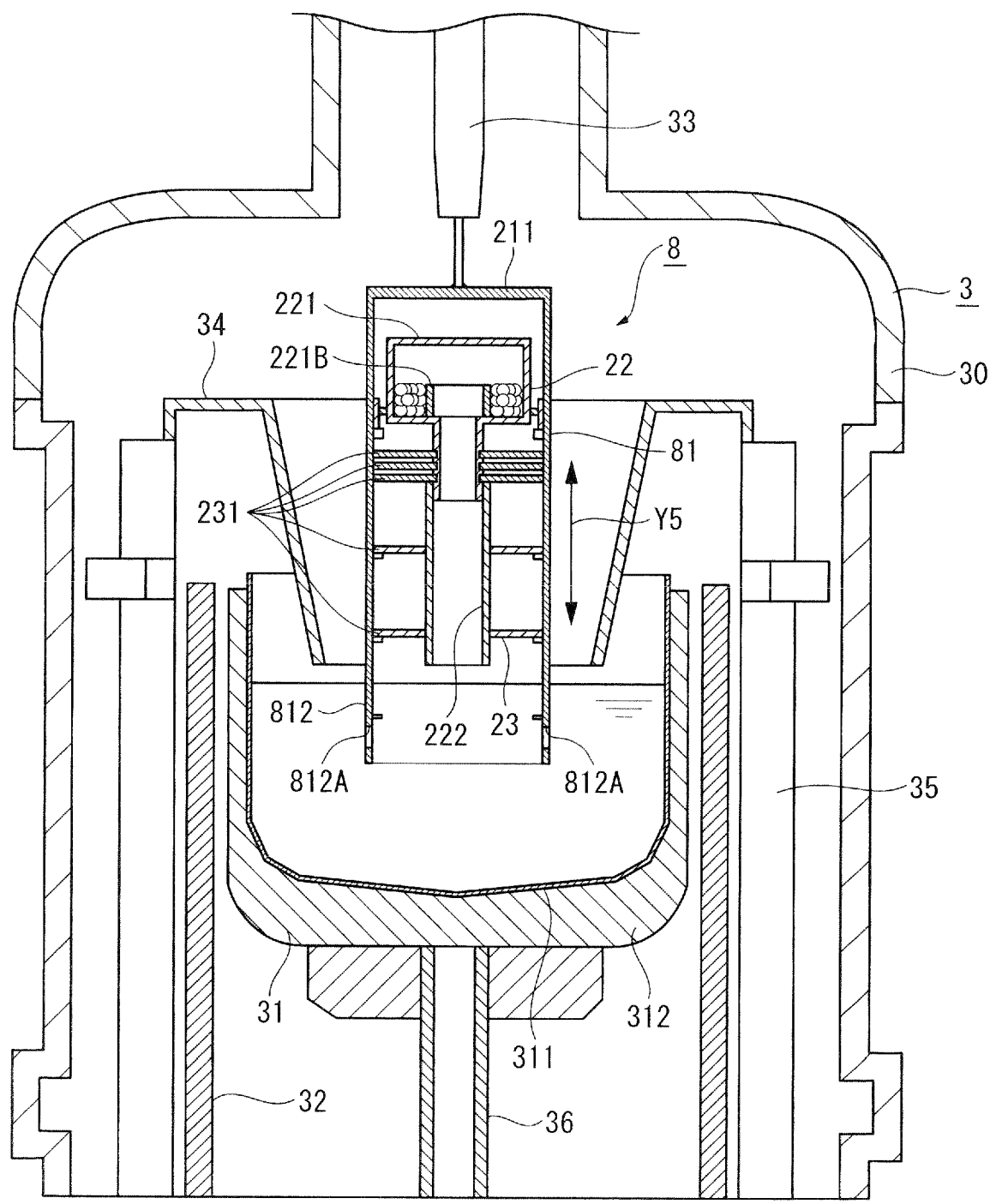
FIG. 9 is a cross-sectional view showing a pull-up device according to a modification of the first to third exemplary embodiments.

The doping device 4 is rotated to form the flow in the arrow Y4 shown in FIG. 3 to enhance the doping efficiency when the melt is doped in the second exemplary embodiment. However, as shown in FIG. 9 for instance, a doping device 8 having an outer tube 81 provided with a through-hole 812A on the lower end of a lateral portion 812 may be vertically driven (in a direction of an arrow Y5) to stir the melt. The doping device 8 is the same as the doping device 2 of the first exemplary embodiment except that the outer tube 81 is provided with the lateral portion 812 having the through-hole 812A.

By vertically driving the doping device 8, the melt can be stirred and the temperature of the accommodating portion 221 of the inner tube 22 can be adjusted to control the sublimation rate of the dopant.

Figure 10:
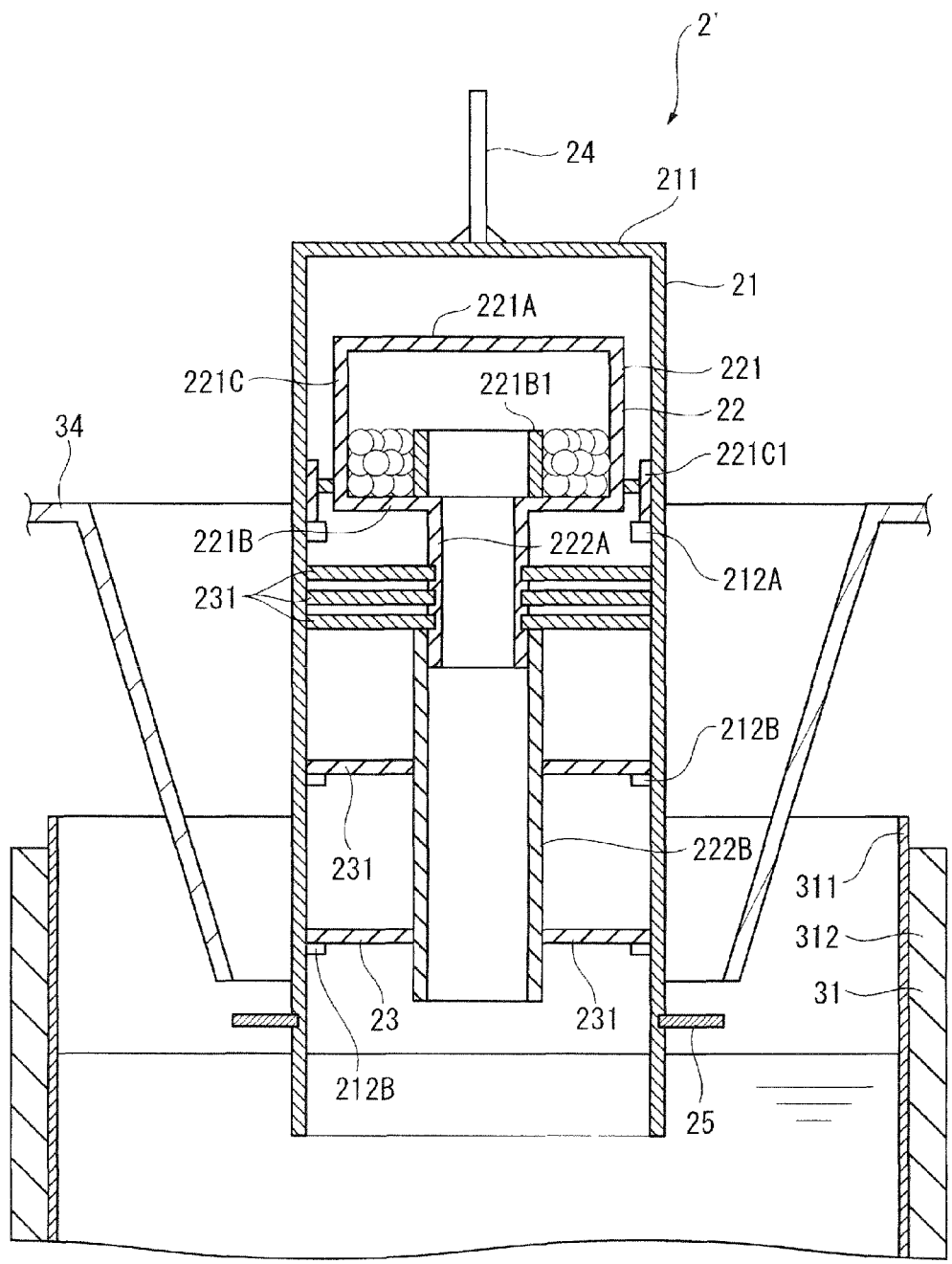
FIG. 10 is a cross-sectional view showing a doping device according to still another modification of the first to third exemplary embodiments.

The radiation of radiant heat of the melt to the accommodating portion 221 is blocked by the heat-shielding member 23 and the shield 34 in the above respective exemplary embodiments. However, for instance, a heat-shielding plate 25 may be provided on the lateral portion 212 of the outer tube 21 of a doping device 2' as shown in FIG. 10 and the radiation of the radiant heat of the melt to the accommodating portion 221 may be blocked by the heat-shielding plate 25, the heat-shielding member 23 and the shield 34. Incidentally, the doping device 2' shown in FIG. 10 is the same as the doping device 2 in the first exemplary embodiment except for the provision of the heat-shielding plate 25.

Though the doping device 4 is rotated to stir the melt to enhance the doping efficiency in the second exemplary embodiment, the tube 55 of the third exemplary embodiment may be provided on the doping device 4 of the second exemplary embodiment. Accordingly, since the path for re-introducing the gas not dissolved in the melt is formed, the doping efficiency can be further enhanced.

Though the doping conditions of the respective exemplary embodiments are defined as: the temperature of the melt at the melting point of silicon or higher and 60° C. above the melting point or lower; the flow volume of the inert gas flowing from above to below the accommodating portion 221 of the doping device being in a range from 50 litters/min to 400 litters/min; and the pressure inside the chamber 30 being 5332 Pa or more and 79980 Pa or less, the doping process may be conducted out of the above range.

Fourth Embodiment

Next, a fourth exemplary embodiment of the invention will be described below.

Figure 13:
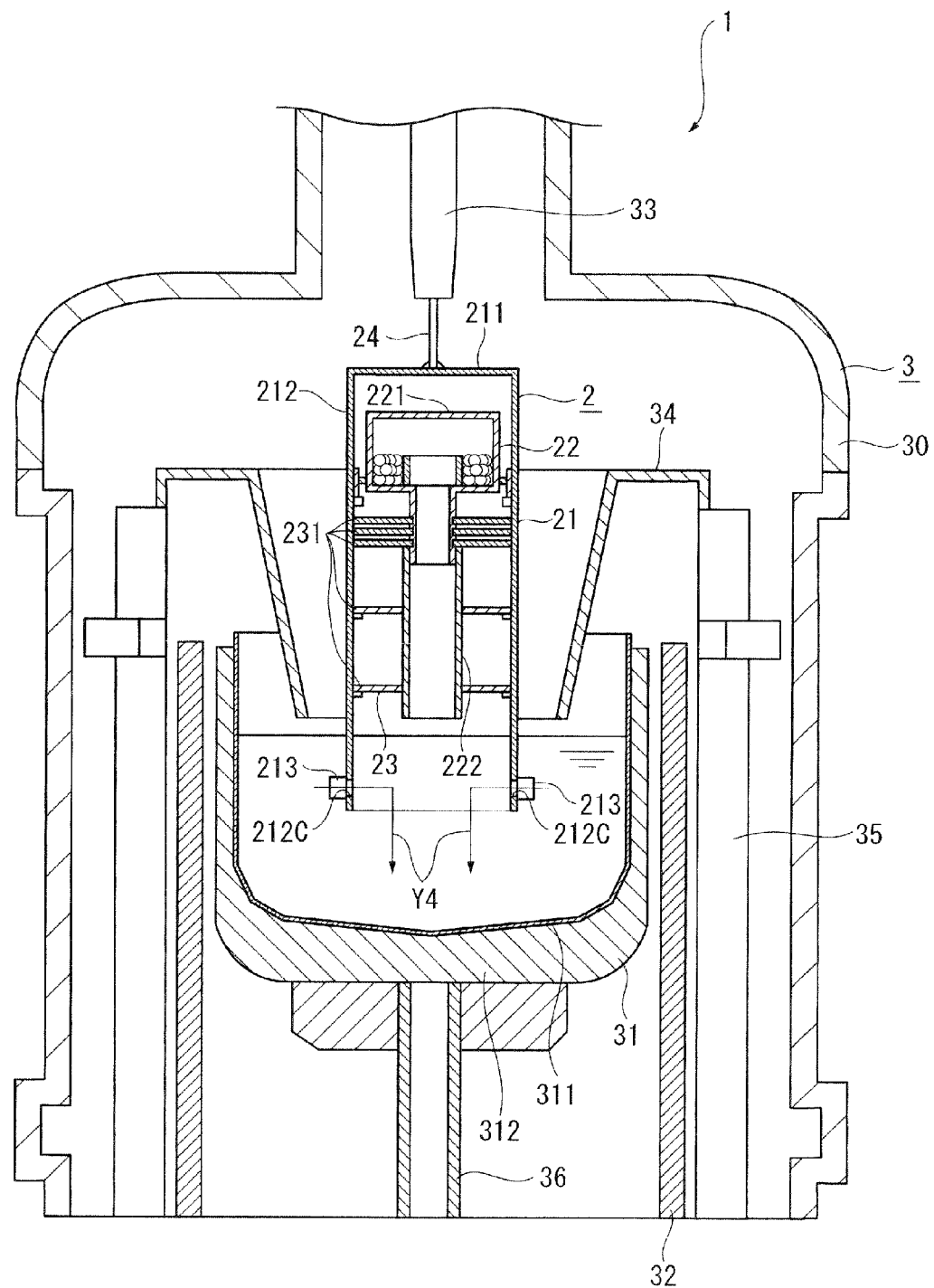
FIG. 13 is a cross-sectional view showing a pull-up device according to a fourth exemplary embodiment of the invention.
Figure 14:
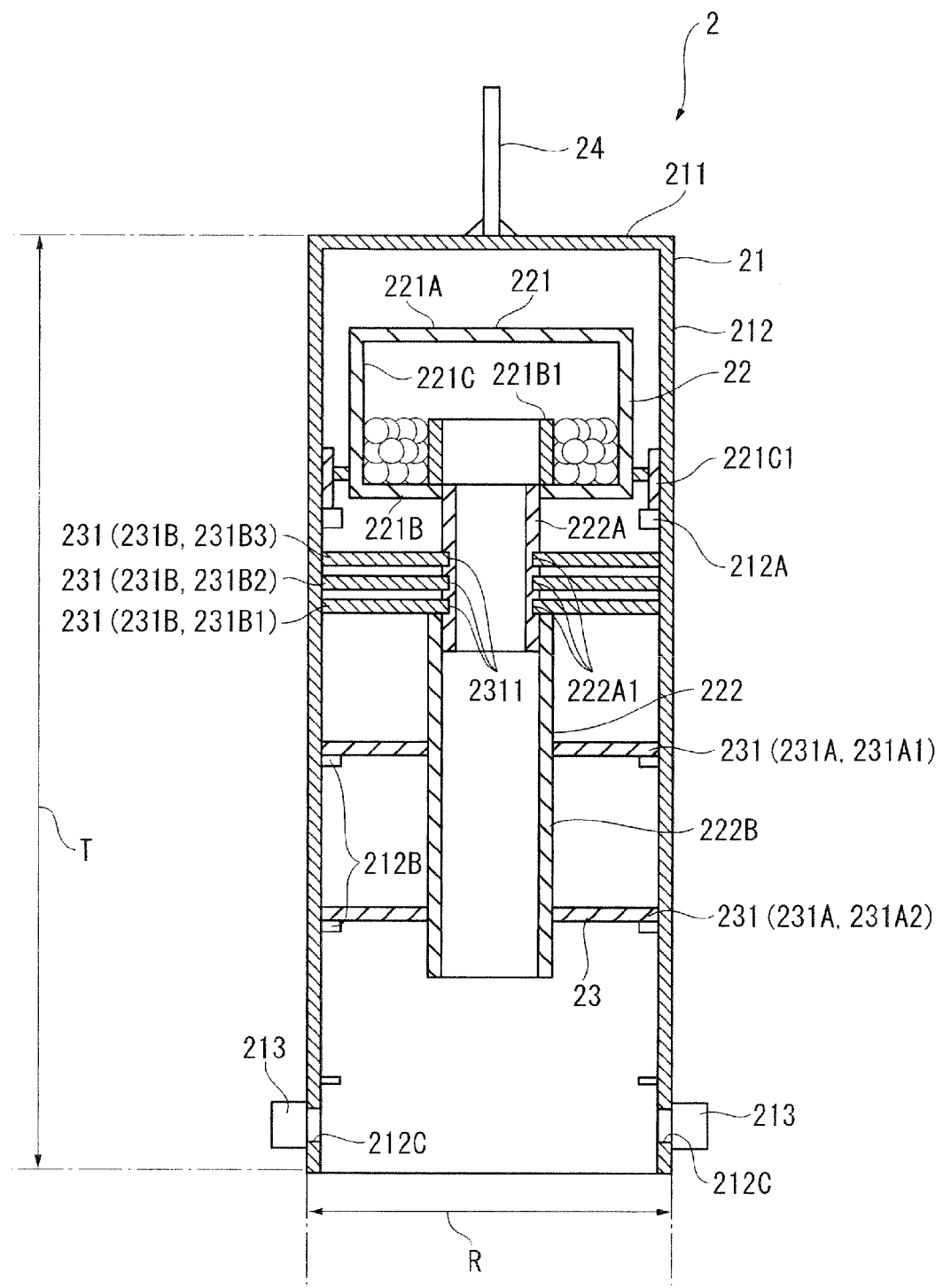
FIG. 14 is a cross-sectional view showing a doping device of the pull-up device.

FIG. 13 shows a pull-up device of this exemplary embodiment. FIG. 14 shows a cross-sectional view showing a doping device of the pull-up device.

The pull-up device 1 includes a pull-up device body 3 and a doping device 2.

The pull-up device body 3 includes a chamber 30, a crucible 31 disposed inside the chamber 30, a heater 32 for heating the crucible 31 by heat radiation, a pull-up portion 33, a shield 34 and a heat insulating cylinder 35.

Inert gas such as argon gas is injected into the chamber 30 from above to below. The pressure inside the chamber 30 is adjustable. During the doping process, the pressure of the inert gas is set in a range from 5332 Pa (converted value of 40 Torr) to 79980 Pa (converted value of 600 Torr).

The crucible 31 melts semiconductor material in the form of polycrystal silicon to prepare a melt. The crucible 31 includes a bottomed cylindrical first crucible 311 made of quartz and a graphite second crucible 312 disposed outside the first crucible 311 to accommodate the first crucible 311. The crucible 31 is supported by a support shaft 36 rotated at a predetermined speed.

The heater 32, which is disposed outside the crucible 31, heats the crucible 31 so as to melt the silicon therein.

The pull-up portion 33, which is disposed above the crucible 31, is mounted with a seed crystal or the doping device 2. The pull-up portion 33 is rotatable.

The heat insulating cylinder 35 is disposed so as to surround the crucible 31 and the heater 32.

The shield 34 is a heat-blocking shield for blocking radiant heat radiated from the heater 32 toward the doping device 2. The shield 34 surrounds the doping device 2 and covers a surface of the melt. The shield 34 is configured as a truncated cone having smaller opening at a lower side than an opening on an upper side.

The doping device 2 is a device for volatilizing a solid dopant and doping the volatilized dopant on the silicon melt in the crucible 31.

The dopant may be, for instance, red phosphorus, arsenic and the like.

The doping device 2 includes an outer tube (tube portion) 21, an inner tube 22 disposed inside the outer tube 21 and a heat-shielding member 23.

The outer tube 21 accommodates the inner tube 22, in which the dopant gas from the inner tube 22 is introduced. In other words, the outer tube 21 works as the tube portion of the invention.

The outer tube 21, which is bottomed-cylindrical with its lower end being opened while its upper end being closed, includes an upper portion 211 for providing an upper end surface and a lateral portion 212 that extends downwardly from an outer periphery of the upper portion 211. In the exemplary embodiment, the lateral portion 212 of the outer tube 21 is configured as a cylinder. The material of the outer tube 21 is, for instance, transparent quartz.

A height T of the outer tube 21 is, for instance, 450 mm. A diameter R of the lateral portion 212 of the outer tube 21 is preferably 100 mm or more and 1.3 times as large as a pull-up diameter or smaller.

The upper portion 211 of the outer tube 21 is provided with a support 24 that protrudes upwardly from the upper portion 211.By mounting the support 24 on the pull-up portion 33 of the pull-up device 1, the outer tube 21 is held by the pull-up device 1.

The upper portion 211 of the outer tube 21 covers a later-described accommodating portion 221 of the inner tube 22 from the above. The upper portion 211 serves as a blow prevention member for preventing the above-mentioned inert gas that flows from top to bottom inside the chamber 30 (in other words, from top to bottom of the accommodating portion 221) from being directly blown against the accommodating portion 221.

A plurality of through-holes 212C are provided on the lower end (the portion immersed in the melt) of the lateral portion 212 of the outer tube 21 at a regular interval along the circumference thereof.

Further, a plurality of vanes 213 are provided on the outer circumference of the lateral portion 212 adjacent to the through-holes 212C.

The vanes 213 are arranged so that vane surfaces thereof are aligned with the axis of the outer tube 21 of the doping device 2. Further, the doping device 2 is rotated around the central axis of the outer tube 21 when the melt is doped, where the vanes 213 are provided on a rear end of the outer tube 21 in the rotary direction (see FIG. 15).

The inner tube 22 includes an accommodating portion 221 and a cylindrical portion 222 connected to the accommodating portion 221 to be in communication therewith.

The material of the inner tube 22 is, for instance, transparent quartz.

The accommodating portion 221, which accommodates solid dopant, is a hollow columnar portion. The accommodating portion 221 includes a substantially plane-circular upper portion 221A, a bottom portion 221B disposed to face the upper portion 221A, a lateral portion 221C disposed between outer peripheries of the upper portion 221A and the bottom portion 221B.

The center of the bottom portion 221B is provided with an opening. Solid dopant is placed on the bottom portion 221B around the opening. When the solid dopant is volatilized, the dopant gas is ejected through the opening. A circumference of the opening is provided with a drop preventing wall 221B1 for preventing the solid dopant from being dropped.

The dopant accommodated in the accommodating portion 221 is preferably positioned at a position where its temperature approaches the sublimation temperature of the dopant because, when the accommodating portion 221 is close to the melt surface, high temperature therefrom deteriorates thermal insulating effects. In this embodiment, the dopant is exemplarily placed approximately 300 mm away from the surface of the melt.

The lateral portion 221C is provided with a support piece(s) 221C1 that is substantially T-shaped in cross section, the support piece(s) 221C1 protruding outwardly from the accommodating portion 221. By placing the support piece(s) 221C1 on a support(s) 212A formed on an inner circumference of the outer tube 21, the inner tube 22 is supported by the outer tube 21.

The cylindrical portion 222 is a cylindrical member having open upper and lower end surfaces. An upper end of the cylindrical portion 222 is connected to the opening on the bottom portion 221B of the accommodating portion 221.

A diameter of the cylindrical portion 222 is smaller than that of the outer tube 21, so that a gap is formed between an outer circumference of the cylindrical portion 222 and an inner circumference of the outer tube 21.

In the present embodiment, the cylindrical portion 222 includes a first cylindrical portion 222A connected to the opening of the accommodating portion 221 and a second cylindrical portion 222B connected to the first cylindrical portion 222A to extend downwardly therefrom.

The first cylindrical portion 222A is integrated with the accommodating portion 221 while being provided as a body independent of the second cylindrical portion 222B.

The first cylindrical portion 222A is provided with a plurality of ring-shaped grooves 222A1 formed along a circumferential direction of the first cylindrical portion 222A. In the present embodiment, three grooves 222A1 are formed. The grooves 222A1 serve to support later-described heat-shielding plates 231 of the heat-shielding member 23.

The second cylindrical portion 222B has a diameter of 20 mm or more and 150 mm or less. Since the second cylindrical portion 222B in the present embodiment is a cylindrical member, its opening for ejecting the dopant gas also has a diameter in the range from 20 mm to 150 mm. When the outer tube 21 holds the inner tube 22, a lower distal end of the outer tube 21 protrudes further downward (toward the melt) than a lower distal end of the second cylindrical portion 222B.

The heat-shielding member 23 covers the lower side of the accommodating portion 221 to block the radiant heat from the melt. The heat-shielding member 23 has a plurality (exemplarily, five) of substantially plane-circular heat-shielding plates 231.

The number of the heat-shielding plates 231 may be determined in any suitable manner so that the flow rate of the dopant gas blown onto the melt becomes 3 to 15 L/min. The flow rate of the gas flowing out of the lower end of the cylindrical portion 222 is larger than the flow rate of the evaporant evaporating from the melt.

The sublimation rate of the dopant housed in the accommodating portion 221 is 10 to 50 g/min.

The outer diameter of the heat-shielding plates 231 is substantially equal to the inner diameter of the outer tube 21. The centers of the heat-shielding plates 231 are provided with holes 2311 into which the cylindrical portion 222 is inserted. The heat-shielding plates 231 are substantially horizontally disposed to shield the gap between the cylindrical portion 222 of the inner tube 22 and the outer tube 21 and to be substantially parallel to one another.

In the present embodiment, among the five heat-shielding plates 231, heat-shielding plates 231A disposed adjacently to the melt may be made of, for example, carbon heat-insulating material. The carbon heat-insulating material is formed by impregnating a material such as a thermoplastic resin with carbon fibers, curing the material by heating and burning the material under vacuum or under an atmosphere of inert gas. For heat conductivity of the heat-shielding plates 231A, a material whose heat conductivity is 20 W/m·° C. at 1412° C. may be exemplarily used.

Among the five heat-shielding plates 231, three heat-shielding plates 231B disposed adjacently to the accommodating portion 221 maybe made of opaque quartz. Opaque quartz is formed by, for example, impregnating quartz glass with multiple fine bubbles. For heat conductivity of the heat-shielding plates 231B, a material whose heat conductivity is 8 W/m·° C. at 1412° C. maybe exemplarily used.

The plurality of heat-shielding plates 231 are disposed in the order of the two heat-shielding plates 231A and the three heat-shielding plates 231B from the lower end of the cylindrical portion 222.

The heat-shielding plates 231A are supported by the outer tube 21 such that projections 212B formed on inner sides of the outer tube 21 support the outer peripheries of the heat-shielding plates 231A. A heat-shielding plate 231A (231A1) that is the closest to the melt is disposed, for example, approximately 80 mm above the lower distal end of the cylindrical portion 222.

A heat-shielding plate 231A2 above the heat-shielding plate 231A1 is disposed, for example, approximately 170 mm above the lower distal end of the cylindrical portion 222. Hence, a gap of approximately 90 mm is formed between the heat-shielding plate 231A1 and the heat-shielding plate 231A2.

On the other hand, the heat-shielding plates 231B are supported by the inner tube 22 such that the peripheries of the holes 2311 are supported by the grooves 222A1 of the first cylindrical portion 222A of the cylindrical portion 222 of the inner tube 22.

Among the three heat-shielding plates 231B, a heat-shielding plate 231B1 that is the closest to the melt is disposed, for example, approximately 250 mm above the lower distal end of the cylindrical portion 222.

A heat-shielding plate 231B2 above the heat-shielding plate 231B1 is disposed, for example, approximately 10 mm above the heat-shielding plate 231B1.

A heat-shielding plate 231B3 further above the heat-shielding plate 231B1 is disposed, for example, approximately 10 mm above the heat-shielding plate 231B2. In other words, gaps of a predetermined size are formed between the heat-shielding plates 231B.

The distance between the heat-shielding plate 231B1 and the accommodating portion 221 is exemplarily 30 mm.

Thus arranged doping device 2 is assembled as follows.

Initially, solid dopant is inserted into the accommodating portion 221 of the inner tube 22.

Next, the heat-shielding plate 231B is attached to the first cylindrical portion 222A of the cylindrical portion 222 integrated with the accommodating portion 221. Specifically, the first cylindrical portion 222A is inserted to the central hole 2311 of the respective heat-shielding plates 231A and the peripheries of the holes 2311 of the heat-shielding plates 231B are engaged with the respective grooves 222A1 of the first cylindrical portion 222A.

Subsequently, the first cylindrical portion 222A and the heat-shielding plates 231B are inserted into the outer tube 21 and the support piece 221C of the accommodating portion 221 is placed on the support 212A provided on the outer tube 21.

Next, the heat-shielding plates 231A are inserted into the outer tube 21 and the outer circumference of the heat-shielding plates 231A is supported by the projections 212B of the outer tube 21.

Finally, the second cylindrical portion 222B of the cylindrical portion 222 of the inner tube 22 is inserted into the outer tube 21. Specifically, the second cylindrical portion 222B is inserted into the holes 2311 provided at the center of the heat-shielding plates 231A supported by the outer tube 21.

Then, the upper end of the second cylindrical portion 222B and the lower end of the first cylindrical portion 222A are connected.

The doping device 2 is assembled as described above.

When using the assembled doping device 2, the support 24 provided on the outer tube 21 of the doping device 2 is attached to the pull-up portion 33 of the pull-up device 1.

Inert gas is subsequently flowed from an upper side of the pull-up device 1 toward the melt. The inert gas flows along the surface of the melt.

The inert gas is continuously flowed during conducting the doping and pulling up a grown crystal. The flow rate of the inert gas is set to be in a range of in a range from 50 litters/min to 400 litters/min. When the flow volume of the inert gas is set to exceed 400 litters/min, the accommodating portion 221 may be too cooled to volatilize the dopant.

Next, while rotating the crucible 31 in advance, the lower end of the outer tube 21 is immersed in the melt. At this time, the lower end of the cylindrical portion 222 of the inner tube 22 is set so as not to touch the melt.

Figure 15:
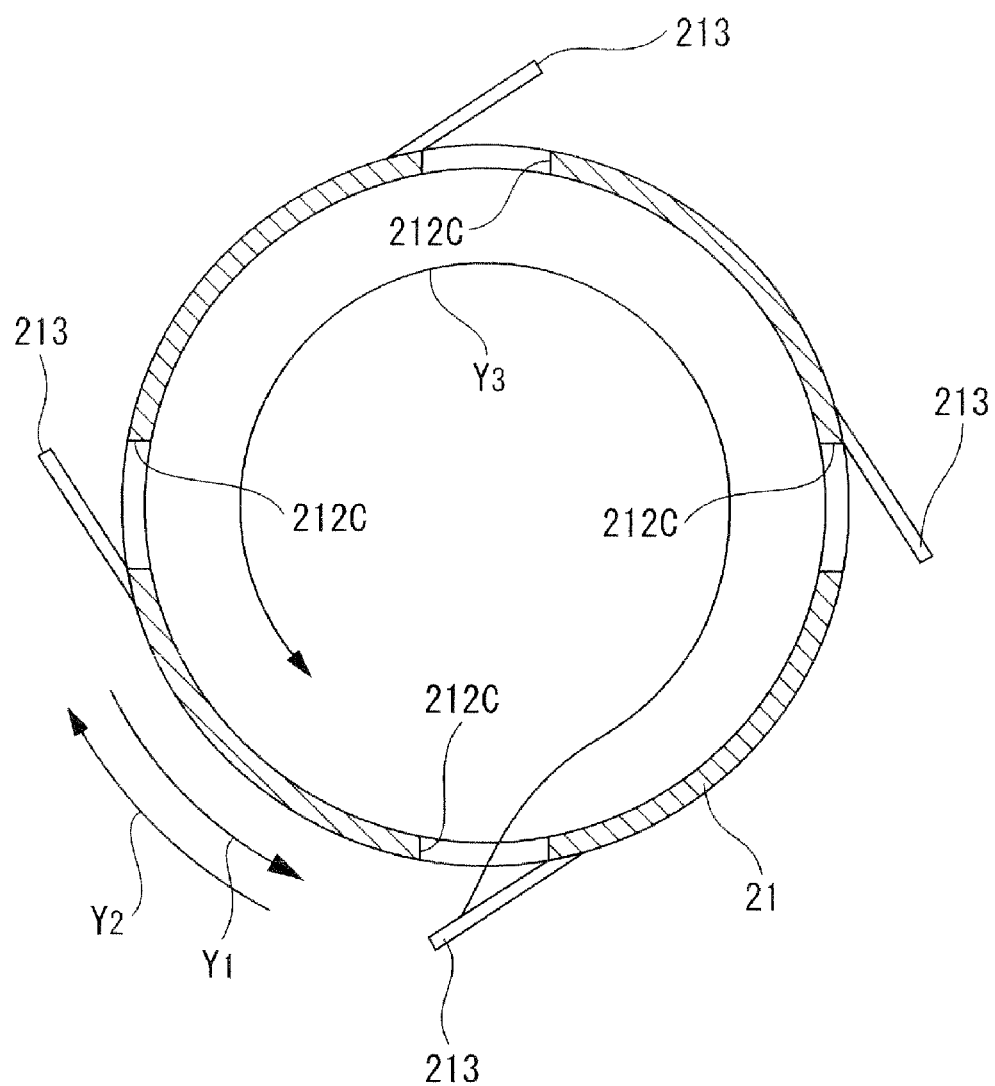
FIG. 15 is a schematic view showing a doping process using the doping device.

Further, as shown in FIG. 15, the doping device 2 is rotated around the central axis of the outer tube 21 in a direction opposite to the rotary direction of the crucible 31. In FIG. 15, an arrow Y1 indicates the rotary direction of the crucible 31, whereas an arrow Y2 indicates the rotary direction of the doping device 2.

The dopant placed inside the accommodating portion 221 of the doping device 2 is gradually sublimated by the heat from the melt, such that the dopant in a gas form is ejected from the cylindrical portion 222 of the doping device 2.

By rotating the doping device 2 and the crucible 31, the melt outside the outer tube 21 collides with the vane 213 provided on the outer tube 21 to be introduced into the outer tube 21 through the through-hole 212C as shown in an arrow Y3 in FIG. 15. The melt inside the outer tube 21 is gradually ejected from the lower side of the outer tube 21 to form a flow in a direction of an arrow Y4 shown in FIG. 13. In other words, the melt surface on which the gas ejected from the cylindrical portion 222 of the inner tube 22 is stirred, so that the gas is always blown on a new melt surface. Further, the melt in which the gas is dissolved is ejected from the opening on the lower end of the outer tube 21.

A temperature of the melt in the crucible 31 at the time of doping is set to be in a range from a melting point of a material of the melt to a point 60° C. above the melting point. In the present embodiment, since the material of the melt is silicon, the temperature of the melt is set to be in a range of 1412° C. or higher and 1472° C. or lower.

When the gas is dissolved in the melt, the pull-up portion 33 of the pull-up device 1 is detached from the doping device 2 and mounted with the seed crystal. Then, the pulling-up of the grown crystal is started.

According to the present embodiment, following effects can be obtained.

(4-1) The doping device 2 is provided with the outer tube 21 having the through-hole 212C at the portion immersed in the melt. Further, the doping device 2 and the crucible 31 are reversely rotated with each other when the melt is doped. By rotating the doping device 2 and the crucible 31, the melt outside the outer tube 21 collides with the vane 213 provided on the outer tube 21 to be introduced into the outer tube 21 through the through-hole 212C to be subjected to the blow of the dopant gas. Then, the melt having been subjected to the blow of the gas is gradually discharged from the opening on the lower end of the outer tube 21.

Since the new melt is always introduced to the portion within the outer tube 21 at which the gas is blown from the inner tube 22, the absorption efficiency of the dopant gas can be enhanced.

(4-2) Since the absorption efficiency of the dopant gas can be enhanced only by rotating the doping device 2 and the crucible 31, the absorption efficiency of the dopant gas can be easily enhanced.

(4-3) Further, since the melt in which the dopant gas is dissolved is discharged from the opening on the lower end of the outer tube 21, the gas containing the dopant no more exists on the surface of the melt, so that the evaporation of the dopant from the melt can be restrained, thus further enhancing the doping efficiency.

(4-4) The shield 34 is provided on the pull-up device 1 so that the shield 34 surrounds the doping device 2 to cover the melt surface. In addition, the doping device 2 includes a heat-shielding plate 231 that shields transmission of heat ray from the melt. The heat-shielding plate 231 is disposed to cover a lower side of the accommodating portion 221 that accommodates the dopant.

Accordingly, the shield 34 and the heat-shielding plate 231 reliably prevent the transfer of the radiant heat of the melt to the accommodating portion 221, so that the volatilization rate of the dopant within the accommodating portion 221 can be lowered as compared with the volatilization rate in a traditional doping device.

Thus, the dopant is not instantaneously volatilized and the blowing pressure of the dopant gas to the melt can be lowered. In this exemplary embodiment, the flow volume of the dopant gas ejected from the doping device 2 to be blown to the melt is controlled in the range from 3 litters/min to 15 litters/min, the melt is not blown off when the gas is blown onto the melt.

Accordingly, since it can be prevented that time allowance for dissolving the dopant into the melt is lost on account of excessively ejected dopant gas, the dopant can be sufficiently dissolved into the melt, so that absorption rate is not deteriorated. Further, it can be prevented that the formation of monocrystal is hindered by the blown-off silicon to make it difficult to manufacture semiconductor wafers having a desired resistance value.

(4-5) The doping device 2 is provided with the cylindrical portion 222 having an upper end in communication with the accommodating portion 221 to guide the volatilized dopant gas to the melt. Since the cylindrical portion 222 is provided, the volatilized dopant gas can be reliably guided to the melt, so that the doping efficiency to the melt can be enhanced.

(4-6) Further, the doping device 2 of the exemplary embodiment includes the cylindrical outer tube 21 that has an opening on the lower end surface and accommodates the inner tube 22 having the accommodating portion 221 and the cylindrical portion 222. When the inert gas is flowed from the upper side of the melt to the surface of the melt in doping the melt, since the doping device 2 includes the outer tube 21 that houses the inner tube 22, the inert gas is not directly blown to the inner tube 22. Accordingly, it can be avoided that the inner tube 22 is cooled by the inert gas to be lower than the evaporation temperature of the dopant.

(4-7) In this exemplary embodiment, the lower end of the outer tube 21 of the doping device 2 is projected toward the melt relative to the lower end of the cylindrical portion 222 of the inner tube 22 so that only the lower end of the outer tube 21 is immersed in the melt to dope the melt.

Even when a part of the gas ejected from the cylindrical portion 222 of the inner tube 22 is not dissolved into the melt, the gas resides within a space defined by the cylindrical portion 222 of the inner tube 22, the outer tube 21 and the heat-shielding plate 231 without being ejected outside the doping device 2, so that the doping efficiency can be enhanced.

(4-8) When the melt is doped, only the lower end of the outer tube 21 is immersed in the melt without immersing the lower end of the cylindrical portion 222 of the inner tube 22, the heat of the melt is not directly transferred to the inner tube 22. Accordingly, the temperature of the accommodating portion 221 is not raised on account of the heat of the melt directly transferred to the inner tube 22. Thus, the increase in the volatilization rate of the dopant in the accommodating portion 221 can be avoided.

(4-9) In this exemplary embodiment, the plurality of heat-shielding plates 231 disposed between the outer tube 21 and the inner tube 22 and covering the lower side of the accommodating portion 221 of the inner tube 22 are provided. Accordingly, the heat ray from the melt can be reliably shielded and the volatilization rate of the dopant in the accommodating portion 221 can be lowered.

(4-10) Since the heat-shielding plate 231 (231B) closest to the accommodating portion 221 of the inner tube 22 of the doping device 2 is made of a material having relatively high heat conductivity such as opaque quartz, the heat is not accumulated in the heat-shielding plate 231B closest to the accommodating portion 221. Accordingly, since the accommodating portion 221 is not heated by the heat accumulated in the heat-shielding plate 231B, the volatilization rate of the dopant in the accommodating portion 221 is not accelerated by the presence of the heat-shielding plate 231B.

Further, since the heat-shielding plate 231A closest to the melt is made of a material having relatively low heat conductivity such as carbon heat-insulating material, the heat transmission from the melt can be blocked at a position remote from the accommodating portion 221, which also contributes to prevention of increase in the volatilization rate of the dopant in the accommodating portion 221.

(4-11) Since the plurality of heat-shielding plates 231 are spaced apart by a predetermined gap, the heat is not easily accumulated in the respective heat-shielding plates 231 as compared with an arrangement in which the heat-shielding plates are superposed.

(4-12) In this exemplary embodiment, the temperature of the melt when being doped is set at the melting point of silicon or higher and 60° C. above the melting point of silicon or lower.

When the temperature of the melt is lower than the melting point of silicon, in the event that the melt temperature is low during the doping process, the surface of the melt may be solidified as a result of lowered silicon temperature when the doping tube is immersed or the gas is blown, so that the gas is not easily absorbed.

On the other hand, when the melt temperature exceeds the point 60° C. above the melting point, the melt may be boiled. Further, when the melt temperature exceeds the point 60° C. above the melting point, evaporation of the dopant gas absorbed in the melt may be promoted to lower the dopant absorption efficiency.

Since the temperature of the melt is set at the melting point of silicon or higher and 60° C. above the melting point or lower in this exemplary embodiment, the above problems can be avoided.

(4-13) When the pressure inside the chamber 30 is 5332 Pa (converted value of 40 Torr) during the doping process, the dopant dissolved in the melt may be easily volatilized.

On the other hand, when the pressure inside the chamber 30 exceeds 79980 Pa (converted value of 600 Torr), though volatilization of the dopant from the melt can be restrained, high pressure resistance is required for the chamber 30, which incurs additional production cost.

In this exemplary embodiment, since the pressure of the inert gas is set in a range from 5332 Pa (converted value of 40 Torr) to 79980 Pa (converted value of 600 Torr) during the doping process, the above problem does not occur.

(4-14) The flow volume of the inert gas flowing from above to below the accommodating portion 221 of the doping device 2 is set at in a range from 50 litters/min to 400 litters/min. Accordingly, the accommodating portion 221 can be cooled by the inert gas, thus allowing adjustment of the volatilization rate of the dopant in the accommodating portion 221.

(4-15) Since the diameter of the ejecting opening of the gas on the second cylindrical portion 222B of the inner tube 22 is 20 mm or more, when the flow volume of the dopant gas is set in a range from 3 litters/min to 15 litters/min, the volatilized dopant gas is not vigorously blown onto the melt, so that blow-off of the melt can be reliably avoided.

(4-16) If the position of the dopant is located very close to the surface of the melt when being doped, the dopant is disposed in a high temperature atmosphere due to the heat of the melt, so that it may become difficult to control the volatilization rate of the dopant.

In this exemplary embodiment, since the position of the dopant is located 300 mm or more above the surface of the melt, the volatilization rate of the dopant can be reliably controlled.

Modification(s) of Fourth Embodiment

The present invention is not limited to the above-described embodiments but may include modifications and improvements made within a scope where an object of the present invention can be achieved.

For instance, the doping device 2 in the fourth exemplary embodiment includes the outer tube 21 and the inner tube 22, the outer tube may not be provided.

Figure 16:
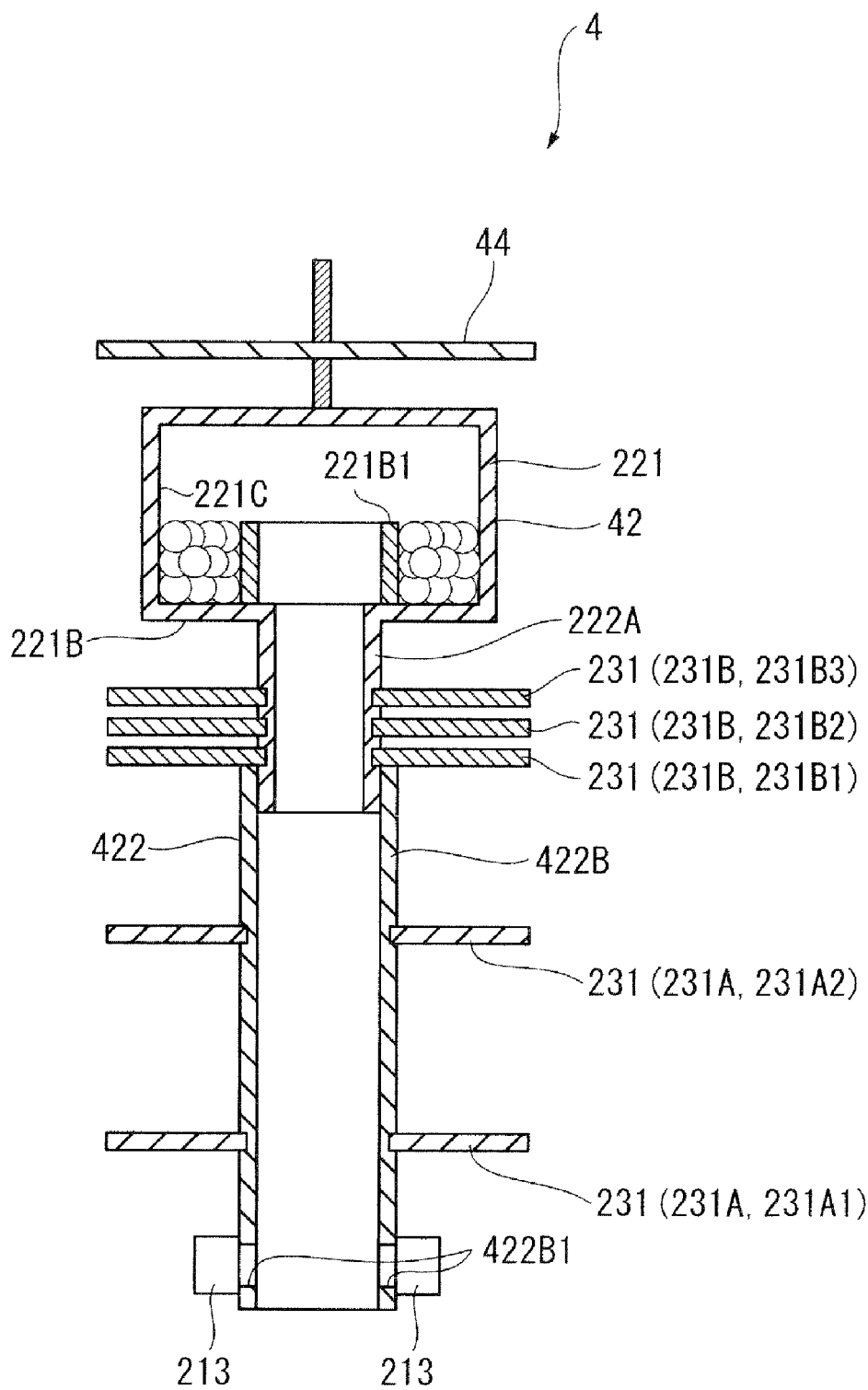
FIG. 16 is a cross-sectional view showing a doping device according to a modification of the fourth exemplary embodiment of the invention.

As shown in FIG. 16, the doping device 4 having an inner tube 42 may be used. The doping device 4 includes the inner tube 42, the heat-shielding member 23 and a blow prevention plate 44. The blow prevention plate 44 prevents the inert gas flowing in the chamber 30 from directly touching the accommodating portion 221 of the inner tube.

The inner tube 42 includes the accommodating portion 221 and a cylindrical portion 422 (tube portion). The cylindrical portion 422 includes a first cylindrical portion 222A and a second cylindrical portion 422B. The second cylindrical portion 422B is provided with through-holes 422B1. Vanes 213 are provided adjacent to the through-holes 422B1.

When the melt is doped using the doping device 4, the through-holes 422B1 and the vanes 213 are immersed into the melt and the doping device 4 and the crucible are rotated.

With the use of such doping device 4, since the outer tube is no longer necessary, the number of the components can be reduced.

Though the doping device 2 of the fourth exemplary embodiment includes the heat-shielding plates 231 covering the lower side of the accommodating portion 221 of the inner tube 22, the doping device may alternatively be provided with a heat-shielding member covering the lateral portion 221C as well as the lower side of the accommodating portion 221. For instance, a heat-insulating material may be wound on the lateral portion 221C and the bottom portion 221B of the accommodating portion 221. With this arrangement, the transmission of the radiant heat from the melt to the accommodating portion 221 can be further reliably prevented.

Though the doping device 2 of the fourth exemplary embodiment includes the heat-shielding member 23, the heat-shielding member may not be provided.

Figure 17:
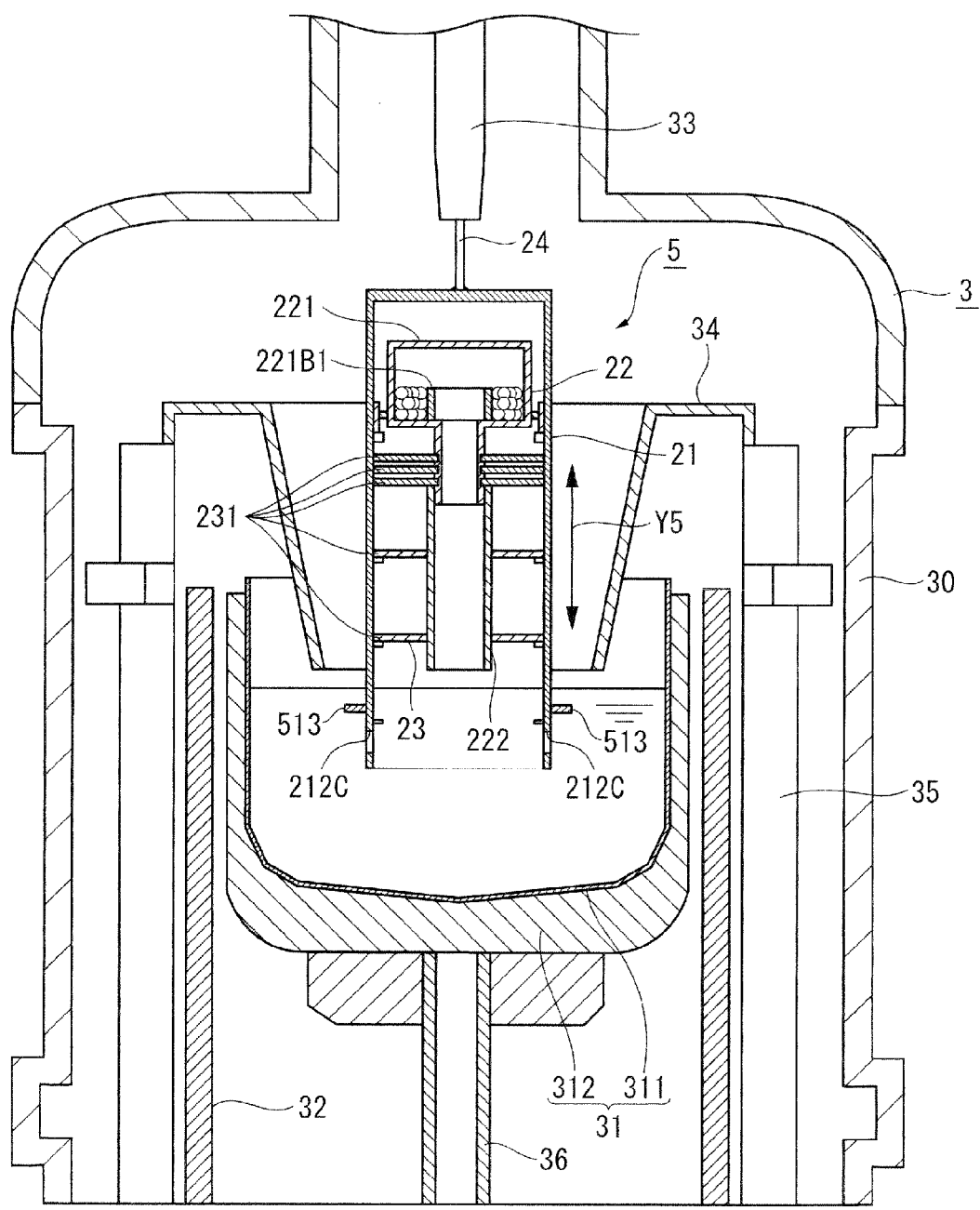
FIG. 17 is a cross-sectional view showing a pull-up device according to another modification of the fourth exemplary embodiment of the invention.

Though the doping device 2 is rotated to form the flow in the arrow Y4 shown in FIG. 13 to enhance the doping efficiency when the melt is doped in the fourth exemplary embodiment, a doping device 5 having no vanes may be vertically driven (in a direction of an arrow Y5) to stir the melt as shown in FIG. 17. The doping device 5 is the same as the doping device 2 of the fourth exemplary embodiment except that a horizontally protruding vanes 513 are provided above the through-holes 212C.

By vertically driving the doping device 5, the melt can be stirred by the vanes 513 and the temperature of the accommodating portion 221 of the inner tube 22 can be adjusted to control the sublimation rate of the dopant.

Though both of the doping device 2 and the crucible 31 are reversely rotated in the fourth exemplary embodiment when the melt is doped, only one of the doping device 2 and the crucible 31 may be rotated. Incidentally, when the crucible 31 is rotated while the doping device 2 is fixed, the vanes 213 of the doping device 2 are preferably provided on a front end in a rotary direction of the crucible 31 relative to the through-holes 212C.

Though the lower end of the outer tube 21 of the doping devices 2 protrudes relative to the lower end of the inner tube 22 in the fourth exemplary embodiment, the lower end of the inner tube 22 and the lower end of the outer tube may be situated at the same level relative to the melt.

Though the doping device 2 of the fourth exemplary embodiment includes the heat-shielding plates 231 covering the lower side of the accommodating portion 221 of the inner tube 22, the doping device may alternatively be provided with a heat-shielding member covering the lateral portion 221C as well as the lower side of the accommodating portion 221. For instance, a heat-insulating material may be wound on the lateral portion 221C and the bottom portion 221B of the accommodating portion 221. With this arrangement, the transmission of the radiant heat from the melt to the accommodating portion 221 can be further reliably prevented.

Fifth Embodiment

A fifth exemplary embodiment will be described below with reference to FIGS. 1 and 2.

FIG. 1 shows a pull-up device of this exemplary embodiment. FIG. 2 shows a cross-sectional view showing a doping device of the pull-up device.

The pull-up device 1 includes a pull-up device body 3 and a doping device 2.

The pull-up device body 3 includes a chamber 30, a crucible 31 disposed inside the chamber 30, a heater 32 for heating the crucible 31 by heat radiation, a pull-up portion 33, a shield 34 and a heat insulating cylinder 35.

Inert gas such as argon gas is injected into the chamber 30 from above to below. The pressure inside the chamber 30 is adjustable. During the doping process, the pressure of the inert gas is set in a range from 5332 Pa (converted value of 40 Torr) to 79980 Pa (converted value of 600 Torr).

The crucible 31 melts semiconductor wafer material in the form of polycrystal silicon to prepare a silicon melt. The crucible 31 includes a bottomed cylindrical first crucible 311 made of quartz and a graphite second crucible 312 disposed outside the first crucible 311 to accommodate the first crucible 311. The crucible 31 is supported by a support shaft 36 rotated at a predetermined speed.

The heater 32, which is disposed outside the crucible 31, heats the crucible 31 so as to melt the silicon therein.

The pull-up portion 33, which is disposed above the crucible 31, is mounted with a seed crystal or the doping device 2. The pull-up portion 33 is rotatable.

The heat insulating cylinder 35 is disposed so as to surround the crucible 31 and the heater 32.

The shield 34 is a heat-blocking shield for blocking radiant heat radiated from the heater 32 toward the doping device 2. The shield 34 surrounds the doping device 2 and covers a surface of the melt. The shield 34 is configured as a truncated cone having smaller opening at a lower side than an opening on an upper side.

The doping device 2 is a device for volatilizing a solid dopant and doping the volatilized dopant on the silicon melt in the crucible 31.

The dopant may be, for instance, red phosphorus, arsenic and the like.

The doping device 2 includes an outer tube 21, an inner tube 22 disposed inside the outer tube 21 and a heat-shielding member 23.

The outer tube 21, which is bottomed-cylindrical with its lower end being opened while its upper end being closed, includes an upper portion 211 for providing an upper end surface and a lateral portion 212 that extends downwardly from an outer periphery of the upper portion 211. In the exemplary embodiment, the lateral portion 212 of the outer tube 21 is configured as a cylinder. The material of the outer tube 21 is, for instance, transparent quartz.

A height T of the outer tube 21 is, for instance, 450 mm. A diameter R of the lateral portion 212 of the outer tube 21 is preferably 100 mm or more and 1.3 times as large as a pull-up crystal diameter or smaller.

The upper portion 211 of the outer tube 21 is provided with a support 24 that protrudes upwardly from the upper portion 211. By mounting the support 24 on the pull-up portion 33 of the pull-up device 1, the outer tube 21 is held by the pull-up device 1.

The upper portion 211 of the outer tube 21 covers a later-described accommodating portion 221 of the inner tube 22 from the above. The upper portion 211 serves as a blow prevention member for preventing the above-mentioned inert gas that flows from top to bottom inside the chamber 30 (in other words, from top to bottom of the accommodating portion 221) from being directly blown against the accommodating portion 221.

The inner tube 22 includes an accommodating portion 221 and a cylindrical portion 222 connected to the accommodating portion 221 to be in communication therewith.

The material of the inner tube 22 is, for instance, transparent quartz.

The accommodating portion 221, which accommodates solid dopant, is a hollow columnar portion. The accommodating portion 221 includes a substantially plane-circular upper portion 221A, a bottom portion 221B disposed to face the upper portion 221A, a lateral portion 221C disposed between outer peripheries of the upper portion 221A and the bottom portion 221B.

The center of the bottom portion 221B is provided with an opening. Solid dopant is placed on the bottom portion 221B around the opening. When the solid dopant is volatilized, the dopant gas is ejected through the opening. A circumference of the opening is provided with a drop preventing wall 221B1 for preventing the solid dopant from being dropped.

The dopant accommodated in the accommodating portion 221 is preferably positioned at a position where its temperature approaches the sublimation temperature of the dopant because, when the accommodating portion 221 is close to the melt, high temperature therefrom deteriorates thermal insulating effects. In this embodiment, the dopant is exemplarily placed approximately 300 mm away from the surface of the melt.

The lateral portion 221C is provided with a support piece(s) 221C1 that is substantially T-shaped in cross section, the support piece(s) 221C1 protruding outwardly from the accommodating portion 221. By placing the support piece(s) 221C1 on a support(s) 212A formed on an inner circumference of the outer tube 21, the inner tube 22 is supported by the outer tube 21.

The cylindrical portion 222 is a cylindrical member having open upper and lower end surfaces. An upper end of the cylindrical portion 222 is connected to the opening on the bottom portion 221B of the accommodating portion 221.

A diameter of the cylindrical portion 222 is smaller than that of the outer tube 21, so that a gap is formed between an outer circumference of the cylindrical portion 222 and an inner circumference of the outer tube 21.

In the present embodiment, the cylindrical portion 222 includes a first cylindrical portion 222A connected to the opening of the accommodating portion 221 and a second cylindrical portion 222B connected to the first cylindrical portion 222A to extend downwardly therefrom.

The first cylindrical portion 222A is integrated with the accommodating portion 221 while being provided as a body independent of the second cylindrical portion 222B.

The first cylindrical portion 222A is provided with a plurality of ring-shaped grooves 222A1 formed along a circumferential direction of the first cylindrical portion 222A. In the present embodiment, three grooves 222A1 are formed. The grooves 222A1 serve to support later-described heat-shielding plates 231 of the heat-shielding member 23.

The second cylindrical portion 222B has a diameter of 20 mm or more and 150 mm or less. Since the second cylindrical portion 222B in the present embodiment is a cylindrical member, its opening for ejecting the dopant gas also has a diameter in the range from 20 mm to 150 mm. When the outer tube 21 holds the inner tube 22, a lower distal end of the outer tube 21 protrudes further downward (toward the melt) than a lower distal end of the second cylindrical portion 222B.

The heat-shielding member 23 covers the lower side of the accommodating portion 221 to block the radiant heat from the melt. The heat-shielding member 23 has a plurality (exemplarily, five) of substantially plane-circular heat-shielding plates 231.

The number of the heat-shielding plates 231 may be determined in any suitable manner so that the flow rate of the dopant gas blown onto the melt becomes 3 to 15 L/min. The flow rate of the gas flowing out of the lower end of the cylindrical portion 222 is larger than the flow rate of the evaporant evaporating from the melt.

The sublimation rate of the dopant housed in the accommodating portion 221 is 10 to 50 g/min.

The outer diameter of the heat-shielding plates 231 is substantially equal to the inner diameter of the outer tube 21. The centers of the heat-shielding plates 231 are provided with holes 2311 into which the cylindrical portion 222 is inserted. The heat-shielding plates 231 are substantially horizontally disposed to shield the gap between the cylindrical portion 222 of the inner tube 22 and the outer tube 21 and to be substantially parallel to one another.

In the present embodiment, among the five heat-shielding plates 231, heat-shielding plates 231A disposed adjacently to the melt may be made of, for example, carbon heat-insulating material. The carbon heat-insulating material is formed by impregnating a material such as a thermoplastic resin with carbon fibers, curing the material by heating and burning the material under vacuum or under an atmosphere of inert gas. For heat conductivity of the heat-shielding plates 231A, a material whose heat conductivity is 20 W/m·° C. at 1412° C. may be exemplarily used.

Among the five heat-shielding plates 231, three heat-shielding plates 231B disposed adjacently to the accommodating portion 221 maybe made of opaque quartz. Opaque quartz is formed by, for example, impregnating quartz glass with multiple fine bubbles. For heat conductivity of the heat-shielding plates 231B, a material whose heat conductivity is 8 W/m·° C. at 1412° C. may be exemplarily used.

The plurality of heat-shielding plates 231 are disposed in the order of the two heat-shielding plates 231A and the three heat-shielding plates 231B from the lower end of the cylindrical portion 222.

The heat-shielding plates 231A are supported by the outer tube 21 such that projections 212B formed on inner sides of the outer tube 21 support the outer peripheries of the heat-shielding plates 231A. A heat-shielding plate 231A (231A1) that is the closest to the melt is disposed, for example, approximately 80 mm above the lower distal end of the cylindrical portion 222.

A heat-shielding plate 231A2 above the heat-shielding plate 231A1 is disposed, for example, approximately 170 mm above the lower distal end of the cylindrical portion 222. Hence, a gap of approximately 90 mm is formed between the heat-shielding plate 231A1 and the heat-shielding plate 231A2.

On the other hand, the heat-shielding plates 231B are supported by the inner tube 22 such that the peripheries of the holes 2311 are supported by the grooves 222A1 of the first cylindrical portion 222A of the cylindrical portion 222 of the inner tube 22.

Among the three heat-shielding plates 231B, a heat-shielding plate 231B1 that is the closest to the melt is disposed, for example, approximately 250 mm above the lower distal end of the cylindrical portion 222.

A heat-shielding plate 231B2 above the heat-shielding plate 231B1 is disposed, for example, approximately 10 mm above the heat-shielding plate 231B1.

A heat-shielding plate 231B3 further above the heat-shielding plate 231B1 is disposed, for example, approximately 10 mm above the heat-shielding plate 231B2. In other words, gaps of a predetermined size are formed between the heat-shielding plates 231B.

The distance between the heat-shielding plate 231B1 and the accommodating portion 221 is exemplarily 30 mm.

Thus arranged doping device 2 is assembled as follows.

Initially, solid dopant is inserted into the accommodating portion 221 of the inner tube 22.

Next, the heat-shielding plate 231B is attached to the first cylindrical portion 222A of the cylindrical portion 222 integrated with the accommodating portion 221. Specifically, the first cylindrical portion 222A is inserted to the central hole 2311 of the respective heat-shielding plates 231A and the peripheries of the holes 2311 of the heat-shielding plates 231B are engaged with the respective grooves 222A1 of the first cylindrical portion 222A.

Subsequently, the first cylindrical portion 222A and the heat-shielding plates 231B are inserted into the outer tube 21 and the support piece 221C of the accommodating portion 221 is placed on the support 212A provided on the outer tube 21.

Next, the heat-shielding plates 231A are inserted into the outer tube 21 and the outer circumference of the heat-shielding plates 231A is supported by the projections 212B of the outer tube 21.

Finally, the second cylindrical portion 222B of the cylindrical portion 222 of the inner tube 22 is inserted into the outer tube 21. Specifically, the second cylindrical portion 222B is inserted into the holes 2311 provided at the center of the heat-shielding plates 231A supported by the outer tube 21. Then, the upper end of the second cylindrical portion 222B and the lower end of the first cylindrical portion 222A are connected.

The doping device 2 is assembled as described above.

When using the assembled doping device 2, the support 24 provided on the outer tube 21 of the doping device 2 is attached to the pull-up portion 33 of the pull-up device 1.

Inert gas is subsequently flowed from an upper side of the pull-up device 1 toward the melt. The inert gas flows along the surface of the melt.

The inert gas is continuously flowed during conducting the doping and pulling up a grown crystal. The flow rate of the inert gas is set to be in a range of in a range from 50 litters/min to 400 litters/min. When the flow volume of the inert gas is set to exceed 400 litters/min, the accommodating portion 221 may be too cooled to volatilize the dopant or that the sublimated dopant may be solidified and adhered.

Next, the lower end of the outer tube 21 is immersed in the melt. At this time, the lower end of the cylindrical portion 222 of the inner tube 22 is set so as not to touch the melt.

The dopant placed inside the accommodating portion 221 of the doping device 2 is gradually sublimated by the heat from the melt, such that the dopant in a gas form is ejected from the cylindrical portion 222 of the doping device 2 to be dissolved in the melt.

A temperature of the melt in the crucible 31 at the time of doping is set in a range from a melting point of a material of the melt to a point 60° C. above the melting point. In the present embodiment, since the material of the melt is silicon, the temperature of the melt is set to be in a range from 1412° C. to 1472° C.

When the gas is dissolved in the melt, the pull-up portion 33 of the pull-up device 1 is detached from the doping device 2 and mounted with the seed crystal. Then, the pulling-up of the grown crystal is started.

According to the present embodiment, following effects can be obtained.

(5-1) The shield 34 is provided on the pull-up device 1 so that the shield 34 surrounds the doping device 2 to cover the melt surface. In addition, the doping device 2 includes a heat-shielding plate 231 that shields transmission of heat ray from the melt. The heat-shielding plate 231 is disposed to cover a lower side of the accommodating portion 221 that accommodates the dopant.

Accordingly, the shield 34 and the heat-shielding plate 231 reliably prevent the transfer of the radiant heat of the melt to the accommodating portion 221, so that the volatilization rate of the dopant within the accommodating portion 221 can be lowered as compared with the volatilization rate in a traditional doping device.

Thus, the dopant is not instantaneously volatilized and the blowing pressure of the dopant gas to the melt can be lowered. In this exemplary embodiment, the flow volume of the dopant gas ejected from the doping device 2 to be blown to the melt is controlled at 3 litters/min or more and 15 litters/min or less, the melt is not blown off when the gas is blown onto the melt.

Accordingly, since it can be prevented that time allowance for dissolving the dopant into the melt is lost on account of excessively ejected dopant gas, the dopant can be sufficiently dissolved into the melt, so that absorption rate is not deteriorated. Further, it can be prevented that the formation of monocrystal is hindered by the blown-off silicon to make it difficult to manufacture semiconductor wafers having a desired resistance value.

(5-2) The doping device 2 is provided with the cylindrical portion 222 having an upper end in communication with the accommodating portion 221 to guide the dopant gas to the melt. Since the cylindrical portion 222 is provided, the volatilized dopant gas can be reliably guided to the melt, so that the doping efficiency to the melt can be enhanced.

(5-3) Further, the doping device 2 of the exemplary embodiment includes the cylindrical outer tube 21 that has an opening on the lower end surface and accommodates the inner tube 22 having the accommodating portion 221 and the cylindrical portion 222. When the inert gas is flowed from the upper side of the melt to the surface of the melt in doping the melt, since the doping device 2 includes the outer tube 21 that houses the inner tube 22, the inert gas is not directly blown to the inner tube 22. Accordingly, it can be avoided that the inner tube 22 is cooled by the inert gas to be lower than the evaporation temperature of the dopant.

(5-4) In this exemplary embodiment, the plurality of heat-shielding plates 231 disposed between the outer tube 21 and the inner tube 22 and covering the lower side of the accommodating portion 221 of the inner tube 22 are provided. Accordingly, the heat ray from the melt can be reliably shielded and the volatilization rate of the dopant in the accommodating portion 221 can be lowered.

(5-5) Since the heat-shielding plate 231 (231B) closest to the accommodating portion 221 of the inner tube 22 of the doping device 2 is made of a material having high heat conductivity such as opaque quartz, the heat is not accumulated in the heat-shielding plate 231B closest to the accommodating portion 221. Accordingly, since the accommodating portion 221 is not heated by the heat accumulated in the heat-shielding plate 231B, the volatilization rate of the dopant in the accommodating portion 221 is not accelerated by the presence of the heat-shielding plate 231B.

Further, since the heat-shielding plate 231A closest to the melt is made of a material having relatively low heat conductivity such as carbon heat-insulating material, the heat transmission from the melt can be blocked at a position remote from the accommodating portion 221, which also contributes to prevention of increase in the volatilization rate of the dopant in the accommodating portion 221.

(5-6) Since the plurality of heat-shielding plates 231 are spaced apart by a predetermined gap, the heat is not easily accumulated in the respective heat-shielding plates 231 as compared with an arrangement in which the heat-shielding plates are superposed.

(5-7) In this exemplary embodiment, the temperature of the melt when being doped is set in the range from the melting point of silicon to the point 60° C. above the melting point of silicon.

When the temperature of the melt is lower than the melting point of silicon, the dopant gas absorption may be hindered. On the other hand, when the melt temperature exceeds the point 60° C. above the melting point, the melt may be boiled. Further, when the melt temperature exceeds the point 60° C. above the melting point, evaporation of the dopant gas absorbed in the melt may be promoted to lower the dopant absorption efficiency.

Since the temperature of the melt is set at the melting point of silicon or higher and 60° C. above the melting point or lower in this exemplary embodiment, the above problems can be avoided.

(5-8) When the pressure inside the chamber 30 is 5332 Pa (converted value of 40 Torr) during the doping process, the dopant dissolved in the melt may be easily volatilized.

On the other hand, when the pressure inside the chamber 30 exceeds 79980 Pa (converted value of 600 Torr), though volatilization of the dopant from the melt can be restrained, high pressure resistance and heat resistance are required for the chamber, which incurs additional production cost.

In the exemplary embodiment, since the pressure inside the chamber 30 when being doped is set within the above range, the above problem can be avoided.

(5-9) The flow volume of the inert gas flowing from above to below the accommodating portion 221 of the doping device 2 is set at in a range from 50 litters/min to 400 litters/min. Accordingly, the accommodating portion 221 can be cooled by the inert gas, thus allowing adjustment of the volatilization rate of the dopant in the accommodating portion 221.

(5-10) Since the diameter of the ejecting opening of the gas on the second cylindrical portion 222B of the inner tube 22 is 20 mm or more, when the flow volume of the dopant gas is set in a range from 3 litters/min to 15 litters/min, the volatilized dopant gas is not vigorously blown onto the melt, so that blow-off of the melt can be reliably avoided.

(5-11) If the position of the dopant is located very close to the surface of the melt when being doped, the dopant is disposed in a high temperature atmosphere due to the heat of the melt, so that it may become difficult to control the volatilization rate of the dopant.

In this exemplary embodiment, since the position of the dopant is located 300 mm or more above the surface of the melt, the volatilization rate of the dopant can be reliably controlled.

Sixth Embodiment

Next, a sixth exemplary embodiment will be described below with reference to FIG. 19. In the following description, the same components as those having been explained above will be referenced with the same numeral to omit the description thereof.

A doping device 5 of this exemplary embodiment has the same inner tube 22, support 24 and heat-shielding member 23 as the fifth exemplary embodiment, an outer tube 51 and a tube 55 disposed between the outer tube 51 and the inner tube 22.

The outer tube 51 has approximately the same structure as the outer tube 21 of the fifth exemplary embodiment except that a plurality of projections 512A extending toward the inside of the outer tube 51 are provided on an inside of the lower end of the outer tube 51. The other arrangement of the outer tube 51 is the same as the outer tube 21 of the fifth exemplary embodiment.

The tube 55 has open upper end and lower end and has a diameter smaller than the outer tube 51 and greater than the cylindrical portion 222 of the inner tube 22. The tube 55 is disposed on the projections 512A and is located between the outer tube 51 and the inner tube 22. A gap is provided between the inner circumference of the lateral portion 212 of the outer tube 51 and the outer circumference of the tube 55. A gap is also provided between the inner circumference of the tube 55 and the cylindrical portion 222 of the inner tube 22.

The height of the tube 55 is smaller than a distance from the lower end of the outer tube 51 to the heat-shielding plate 231A (231A1) closest to the melt, so that a gap is provided between the tube 55 and the heat-shielding plate 231A (231A1).

In this exemplary embodiment, the doping device 5 is used to dope the melt as follows. Incidentally, the pressure in the chamber 30, the flow volume of the inert gas, the temperature of the melt, the position of the dopant from the melt surface, the flow volume of the dopant gas blown to the melt and the sublimation rate of the dopant when the doping process is conducted are the same as those in the fifth exemplary embodiment.

The lower end of the tube 55 is immersed in the melt. At this time, the lower end of the cylindrical portion 222 of the inner tube 22 and the lower end of the outer tube 51 are set so as not to touch the melt.

The dopant placed inside the accommodating portion 221 of the doping device 5 is gradually sublimated by the heat from the melt, such that the dopant in a gas form is ejected from the cylindrical portion 222 of the doping device 5 to be dissolved in the melt.

At this time, some of the gas ejected from the cylindrical portion escapes to the outside of the cylindrical portion 222 without being dissolved in the melt. Further, a part of the gas is reflected on the surface of the melt without being dissolved in the melt. The part of gas passes through the gap between the outer circumference of the lower end of the cylindrical portion 222 and the inner circumference of the tube 55 to go up, and subsequently reflected by the heat-shielding plate 231 to be introduced between the inner circumference of the outer tube 51 and the outer circumference of the tube 55. Then, the gas is introduced to the melt surface (see arrow Y5 in FIG. 19).

In other words, the gap between the outer circumference of the lower end of the cylindrical portion 222 and the inner circumference of the tube 55 and the gap between the inner circumference of the outer tube 51 and the outer circumference of the tube 55 define a path for introducing the gas to the melt surface.

According to this exemplary embodiment, as well as the effects (5-1) to (5-11) of the fifth exemplary embodiment, following effects can be obtained.

(6-1) The doping device 5 includes the tube 55 disposed between the outer tube 51 and the inner tube 22. A part of the gas ejected from the cylindrical portion 222 and not dissolved in the melt passes through the gap between the outer circumference of the lower end of the cylindrical portion 222 and the inner circumference of the tube 55, goes up and subsequently is reflected by the heat-shielding plate 231 to be introduced to the space between the inner circumference of the outer tube 51 and the outer circumference of the tube 55. Then, the gas is re-introduced to the melt surface. Since the gas not dissolved in the melt can be introduced to the melt surface again, the doping efficiency can be enhanced.

Modification(s) of Fifth to Sixth Embodiments

The present invention is not limited to the above-described embodiments but may include modifications and improvements made within a scope where an object of the present invention can be achieved.

For instance, though the doping devices 2, 5 of the fifth and sixth exemplary embodiments include the outer tubes 21, 51, the outer tube may not be provided. For instance, as shown in FIG. 7, a blow-preventing plate 64 for preventing a blow of the gas to the accommodating portion 221 of the inner tube 22 maybe provided above the accommodating portion 221 in place of the outer tube. When the doping device 6 having no outer tube is used, all of the heat-shielding plates 231 are preferably fixed on the inner tube 22.

Figure 20:
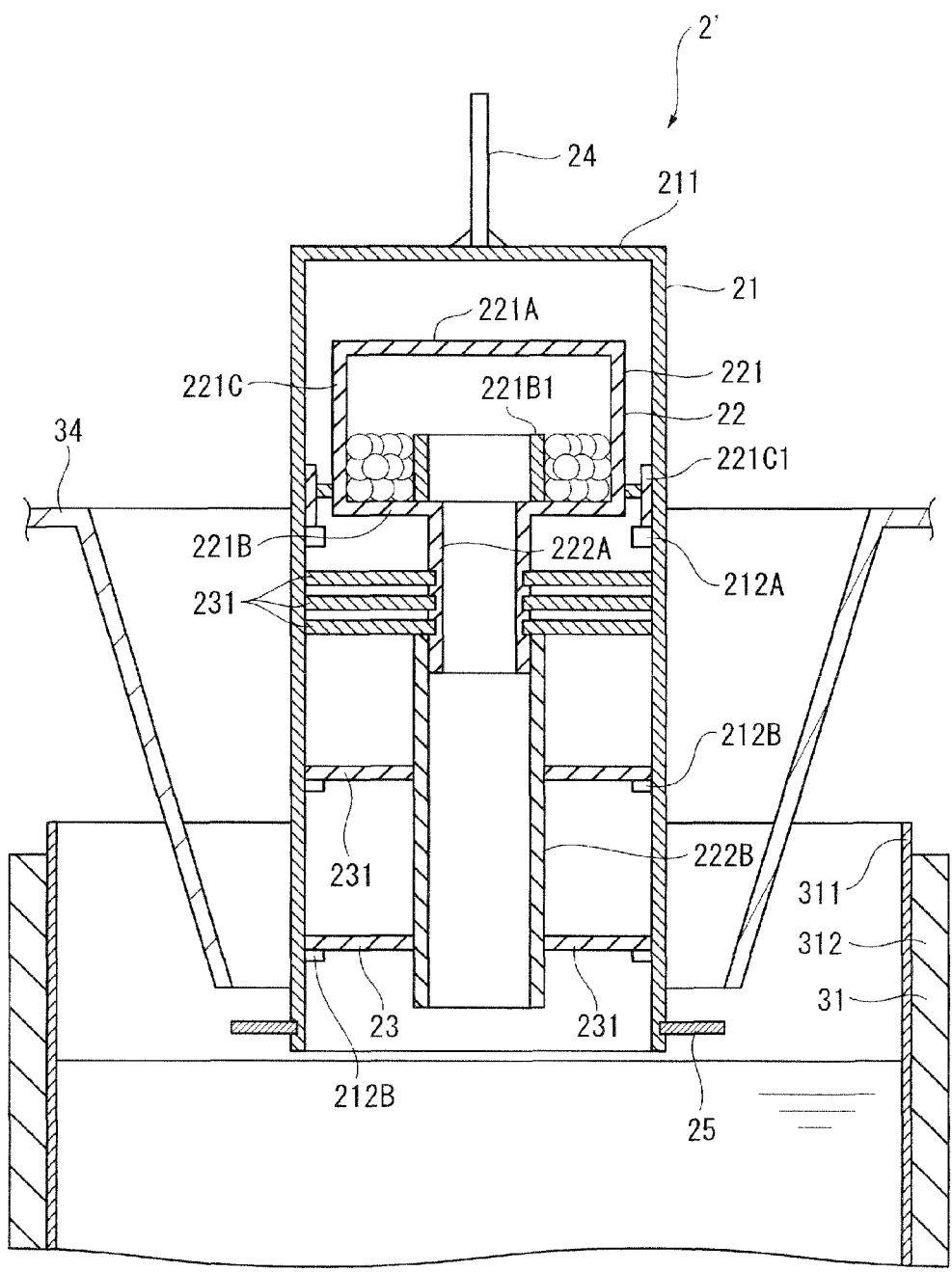
FIG. 20 is a cross-sectional view showing a doping device according to still another modification of the fifth and sixth exemplary embodiments.

The radiation of radiant heat of the melt to the accommodating portion 221 is blocked by the heat-shielding member 23 and the shield 34 in the fifth and sixth exemplary embodiments. However, a heat-shielding plate 25 may be provided on the lateral portion 212 of the outer tube 21 of a doping device 2' as shown in FIG. 20 and the radiation of the radiant heat of the melt to the accommodating portion 221 may be blocked by the heat-shielding plate 25, the heat-shielding member 23 and the shield 34. Incidentally, the doping device 2' shown in FIG. 20 is the same as the doping device 2 in the fifth exemplary embodiment except for the provision of the heat-shielding plate 25.

EXAMPLES

Examples of First to Third Embodiments

Next, examples of the first to third exemplary embodiments will be described below.

The melt was doped using the same pull-up device as that of the first exemplary embodiment and a grown crystal was pulled up by CZ method.

Examples 1 to 6

1. Doping Condition
(1) Doping Device
An outer tube having a diameter of 150 mm was used. The diameter of the second cylindrical portion of the inner tube was 20 mm. Five heat-shielding plates were used as the heat-shielding member, where two graphite heat-shielding plates and three opaque quartz heat-shielding plates were arranged in this order from the lower end of the cylindrical portion.
(2) Other Conditions
The other conditions are shown in Tables 1 and 2. Incidentally, the melt in the crucible was silicon melt. The dopant was 300 g of arsenic.

TABLE 1

|  | Example 1 | Example 2 | Example 3 |
| --- | --- | --- | --- |
| Pressure in Chamber (Pa) | 5332 | 5332 | 59985 |
| Flow Volume of Ar (litters/min) | 50 | 50 | 150 |
| Flow Rate in Chamber (m/s) | 0.218 | 0.218 | 0.058 |
| Temperature of Melt (° C.) | 60° C. above the melting point of Si (1472) | 60° C. above the melting point of Si (1472) | 60° C. above the melting point of Si (1472) |
| Dopant Position (from the Surface of the Melt) | 300 mm above | 300 mm above | 300 mm above |
| Sublimation Rate of Dopant (g/min) | 40 | 50 | 30 |

TABLE 2

|  | Example 4 | Example 5 | Example 6 |
|---|---|---|---|
| Pressure in Chamber (Pa) | 59985 | 59985 | 59985 |
| Flow Volume of Ar (litters/min) | 200 | 200 | 200 |
| Flow Rate in Chamber (m/s) | 0.078 | 0.078 | 0.078 |
| Temperature of Melt (° C.) | Melt point of Si (1412) | 60° C. above the melting point of Si (1472) | 30° C. above the melting point of Si (1442) |
| Dopant Position (from the Surface of the Melt) | 300 mm above | 300 mm above | 300 mm above |
| Sublimation Rate of Dopant (g/min) | 10 | 30 | 20 |

<Comparison 1>

The melt was doped using a doping device having no heat-shielding plate. The doping device was the same as the doping device used in the examples 1 to 6 except that the heat-shielding plate was not provided. The doping conditions are shown in the following Table 3.

TABLE 3

|  | Comparison 1 |
|---|---|
| Pressure in Chamber (Pa) | 5332 |
| Flow Volume of Ar (litters/min) | 50 |
| Flow Rate in Chamber (m/s) | 0.218 |
| Temperature of Melt (° C.) | 60° C. above the melting point of Si (1472) |
| Dopant Position (from the Surface of the Melt) | 300 mm above |
| Sublimation Rate of Dopant (g/min) | 100 |

The grown crystal was pulled up after the doping process was completed. The pulling-up condition was the same as that in the examples 1 to 6.

2. Results

In Tables 1 to 3, the flow rate in the chamber (gas flow rate at the entrance of the chamber) was calculated as:

$V(m/s) = (\text{flow volume (litters/min)})*0.001/60*101300/(\text{pressure in chamber (Pa)})/3.14/(\text{radius(m)})^2$, where radius (m) was based on a diameter of the chamber entrance of inert gas. The flow rate of the dopant was calculated based on a diameter of the exit of the dopant doping tube 222.

Figure 11:
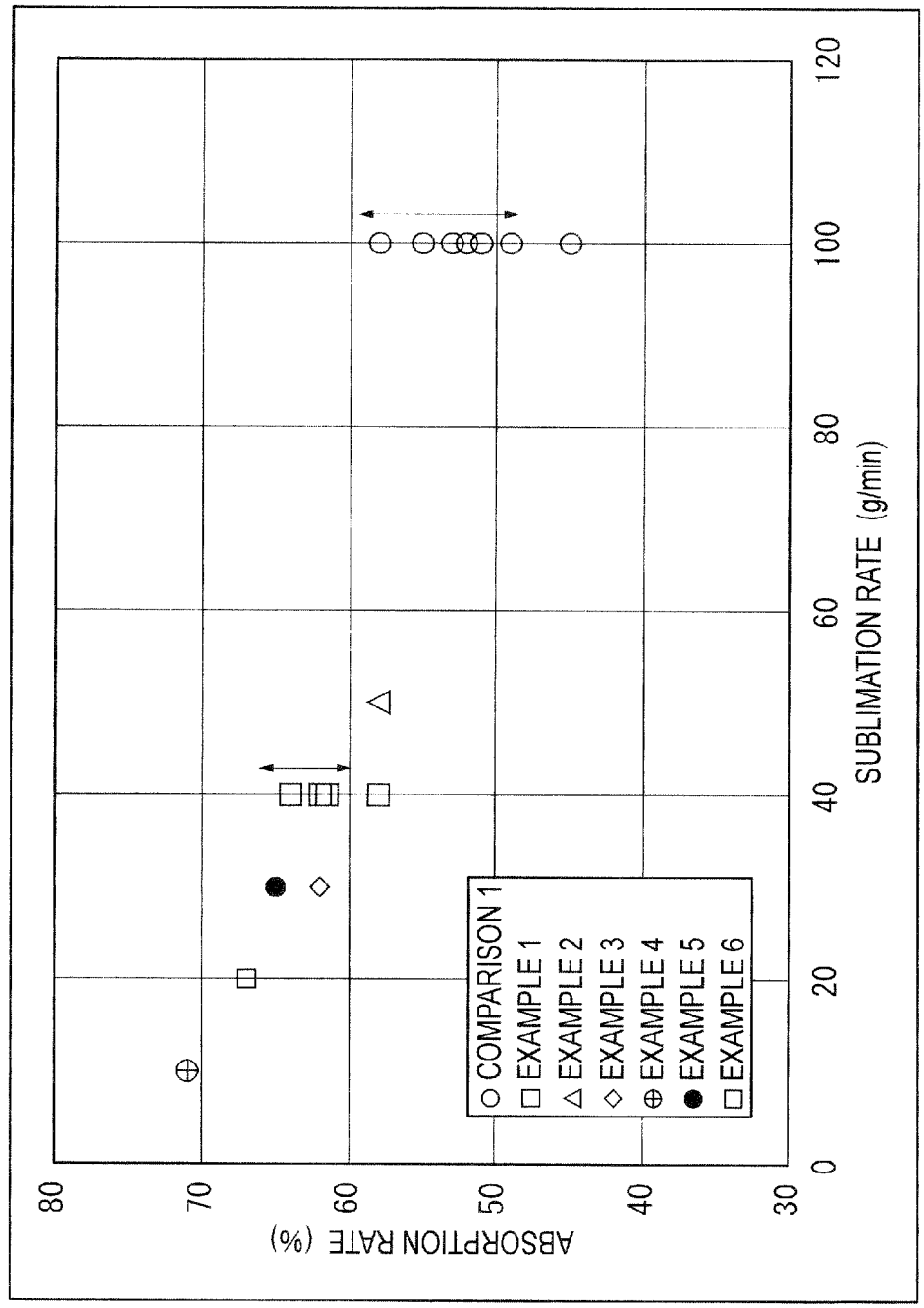
FIG. 11 is a graph showing a relationship between a sublimation rate and doping efficiency obtained by an example according to the first to third exemplary embodiments and a comparison.
Figure 12:
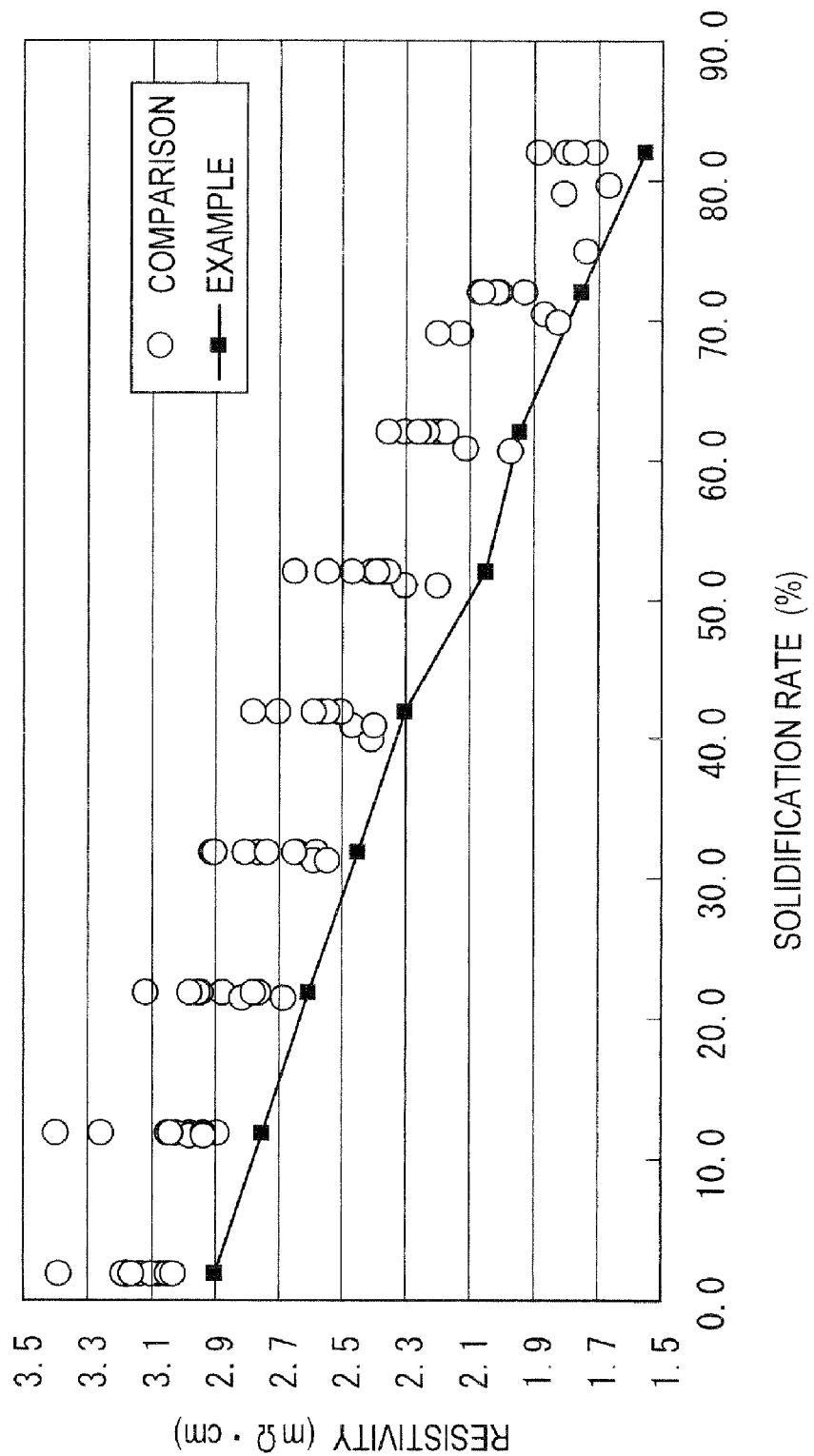
FIG. 12 is a graph showing a distribution of resistivity of an ingot obtained by an example according to the first to third exemplary embodiments and a comparison.

As can be seen in FIG. 11, the relationship between the sublimation rate and absorption rate shown in the Examples 1 to 6 revealed that the doping efficiency was enhanced and less varied as the sublimation rate of the dopant was lowered.

The sublimation rate of the dopant could be restrained at a low level when the flow rate in the chamber (the gas flow rate at the entrance of the chamber) was in a range of 0.05 to 0.2 m/s. When the flow rate in the chamber exceeded 0.2 m/s, the sublimation rate of the dopant was too increased to conduct a proper doping. It was confirmed that 10 to 50 g/min of the sublimation rate of dopant and 0.05 to 0.2 m/s of the flow rate in the chamber were effective.

On the other hand, the comparison 1 showed faster sublimation rate and greater variation of doping efficiency than the examples 1 to 6.

Further, after studying the relationship between the solidification rate and the resistivity for the example 5 and the comparison 1, it was confirmed that the resistivity was 3.0 mΩ·cm or lower for all solidification rates in the example 5. In contrast, great variation was found in the comparison 1 and some of the portions of 0 to 20% solidification rate exhibited resistivity more than 3.0 mΩ·cm. So, it was confirmed that an ingot having resistivity of 3.0 mQΩ·cm or less could not be constantly manufactured.

It is conceivable that a large amount of the dopant is added without using the injecting method according to the first to the third exemplary embodiments for the purpose of producing low-resistive crystal. However, when a large amount of dopant is doped, it is difficult to form a monocrystal and yield rate is lowered. Further, adding a large amount of dopant in a low-absorbing adding method results in extremely low efficiency, unnecessary waste of the dopant, and consequently increase in production cost. Further, when a large amount of dopant is added, since a large amount of evaporant is ejected, the evaporant adheres on an exhaust system of the pull-up device, which requires increased number of maintenance, thereby considerably deteriorating the efficiency.

Examples of Fourth Embodiment

Next, examples of the fourth exemplary embodiment of the invention will be described below.

The melt was doped using the same pull-up device as that of the fourth exemplary embodiment and a grown crystal was pulled up by CZ method.

Examples 7 to 9

1. Doping Condition (1) Doping Device

Example 7

The doping device 5 having the horizontally provided vanes 513 shown in FIG. 17 was used. The diameter of the outer tube was 150 mm. The diameter of the second cylindrical portion of the inner tube was 20 mm. Five heat-shielding plates were used as the heat-shielding member, where two heat-shielding plates made of carbon heat-insulating material and three opaque quartz heat-shielding plates were arranged in this order from the lower end of the cylindrical portion.

Examples 8 and 9

The doping device shown in FIG. 13 was used. The diameter of the outer tube and the inner tube and the other arrangement were the same as the example 7.

Comparison 2: A conventional doping device with an outer tube of 100 mm diameter was used. The doping device had no heat-shielding plate and conducted no tube-immersion.

(2) Other Conditions

The other conditions of the examples 7 to 9 and the comparison 2 will be shown in Table 4. Incidentally, the melt in the crucible was silicon melt. The dopant was 300 g of arsenic. The crucible and the doping device were reversely rotated.

TABLE 4

| | |
|---|---|
| Dopant Amount (g) | 300 |
| Flow Volume of Ar (litters/min) | 200 |
| Pressure in Chamber (Pa) | 59985 |
| Pressure in Chamber (Torr) | 450 |
| Temperature of Melt (° C.) | melting point of Si (1412) |
| Rotation Speed of Crucible (rpm) | 1 |
| Rotation Speed of Doping Device (rpm) | 5 |
| Sublimation Rate (min) | 27 |

<Comparison 2>

The melt was doped using the doping device of the example 7 having no heat-shielding plate. The doping device was the same as the doping device used in the example 7 except that the heat-shielding plate was not provided. The doping condition was the same as that in the example 7.

Subsequently, the grown crystal was pulled up after the doping process was completed. The pulling-up condition was the same as that in the example 7.

2. Results

The absorption rate of the dopant in the examples 7 to 9 was 66% or more, which proved that the dopant was absorbed at a high rate.

In contrast, the absorption rate of the dopant in the comparison 2 was barely 54%.

Figure 18:
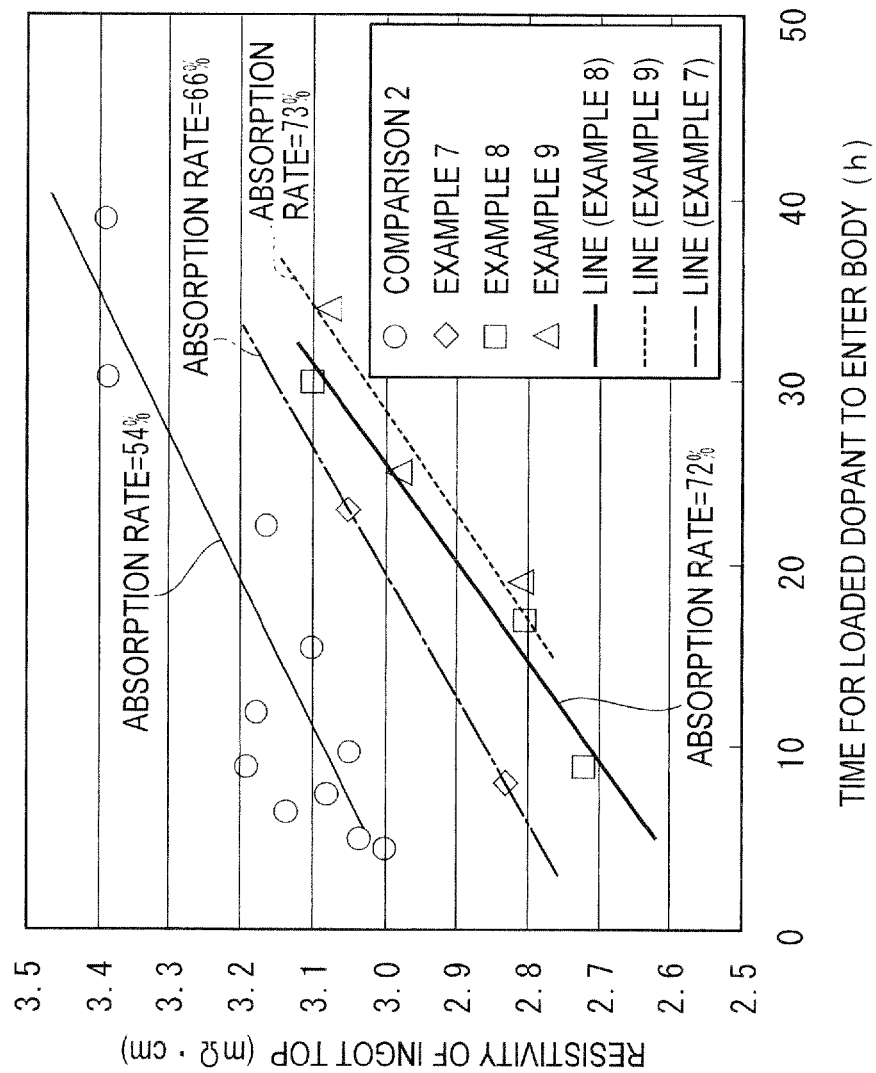
FIG. 18 is a graph showing comparative results of temporal dependence of resistivity of an ingot obtained by examples according to the fourth exemplary embodiment and a comparison.

Further, when temporal dependence of the resistivity of the top of the pulled-up ingots was compared after doping the melt according to the methods of the examples 7 to 9 and the comparison 2 as shown in FIG. 18, it was confirmed that the doping efficiency was enhanced and the resistivity was low in the example 7 as compared to the comparison 2 because no melt was blown off and the blowing speed was controlled in the example 7.

Examples of Fifth to Sixth Embodiments

Next, examples of the fifth and sixth exemplary embodiments of the invention will be described below. The melt was doped using the same pull-up device as that of the fifth exemplary embodiment and a grown crystal was pulled up by CZ method.

Example 10

1. Doping Condition
(1) Doping Device

Figure 19:
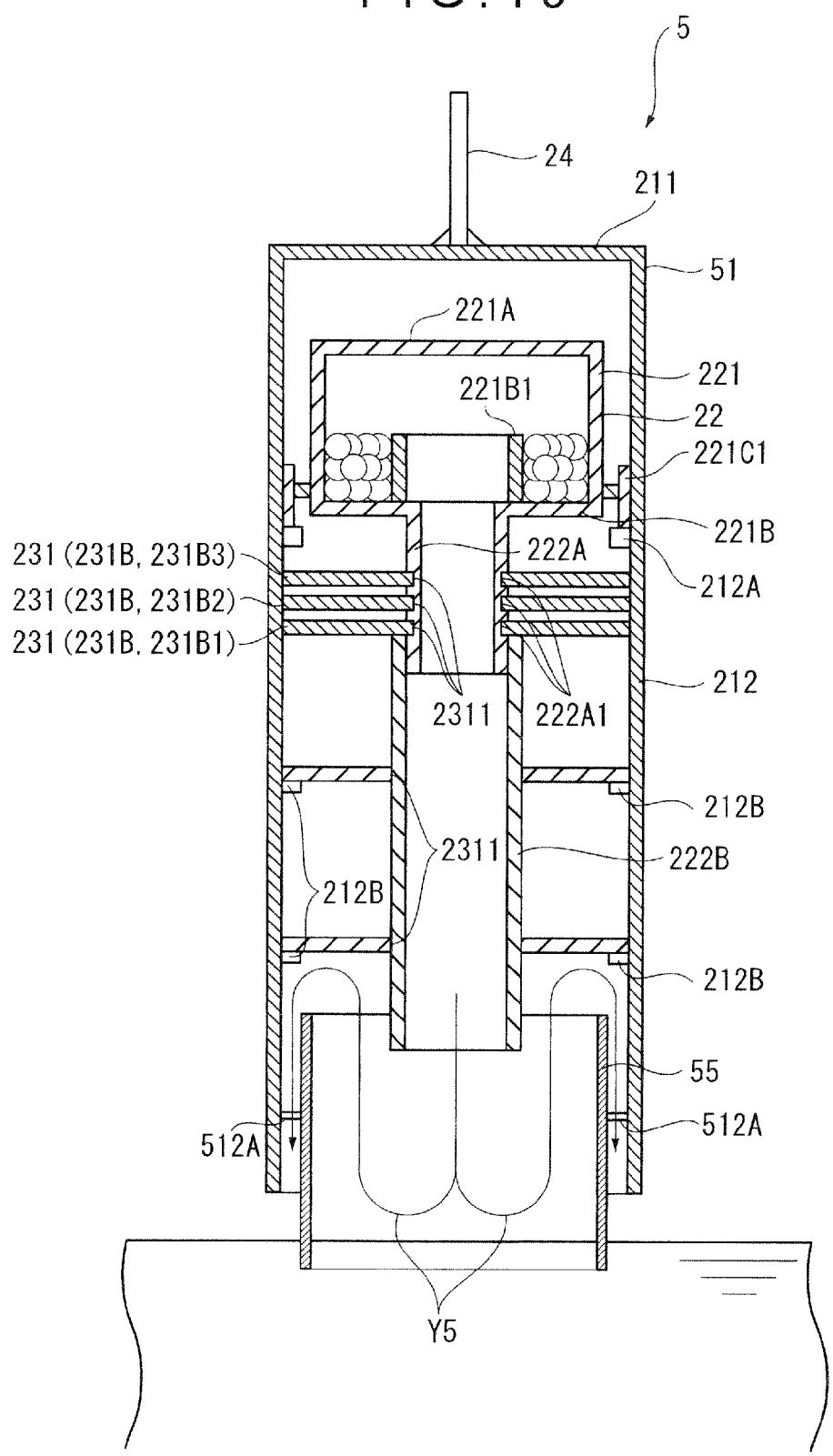
FIG. 19 is a cross-sectional view showing a doping device of a sixth exemplary embodiment of the invention.

The doping device 5 shown in FIG. 19 was used. The diameter of the outer tube was 150 mm. The diameter of the second cylindrical portion of the inner tube was 20 mm. Five heat-shielding plates were used as the heat-shielding member, where two heat-shielding plates made of carbon heat-insulating material and three opaque quartz heat-shielding plates were arranged in this order from the lower end of the cylindrical portion.

(2) Other Conditions

The other conditions are shown in Table 5. Incidentally, the melt in the crucible was silicon melt. The dopant was 300 g of arsenic.

TABLE 5

| | |
|---|---|
| Dopant amount (g) | 300 |
| Ar flow volume (litters/min) | 50 |
| Pressure in chamber (Pa) | 5332 |
| Pressure in chamber (Torr) | 40 |
| Melt temperature (° C.) | Melt point of silicon (1412) + 60 |

<Comparison 3>

The melt was doped using the doping device shown in FIG. 2 of which heat-shielding plate was removed. The doping device was the same as the doping device used in the example 10 except that the heat-shielding plate is not provided. The doping condition was the same as the example 10.

Subsequently, the grown crystal was pulled up after the doping process was completed. The pulling-up condition was the same as that in the example 10.

2. Results

The sublimation rate of dopant was 50 g/min and the flow volume of the dopant gas ejected from the doping device was 15 litters/min in the example 10. No melt was spattered when the melt was doped in the example 10.

In contrast, the sublimation rate of dopant was 100 g/min and the flow volume of the dopant gas ejected from the doping device was 25 litters/min in the comparison 3. The melt was spattered when the melt was doped in the comparison 3.

It was confirmed that melt spatter could be avoided and semiconductor wafers having a desired resistance value could be manufactured in the example 10.

Figure 21:
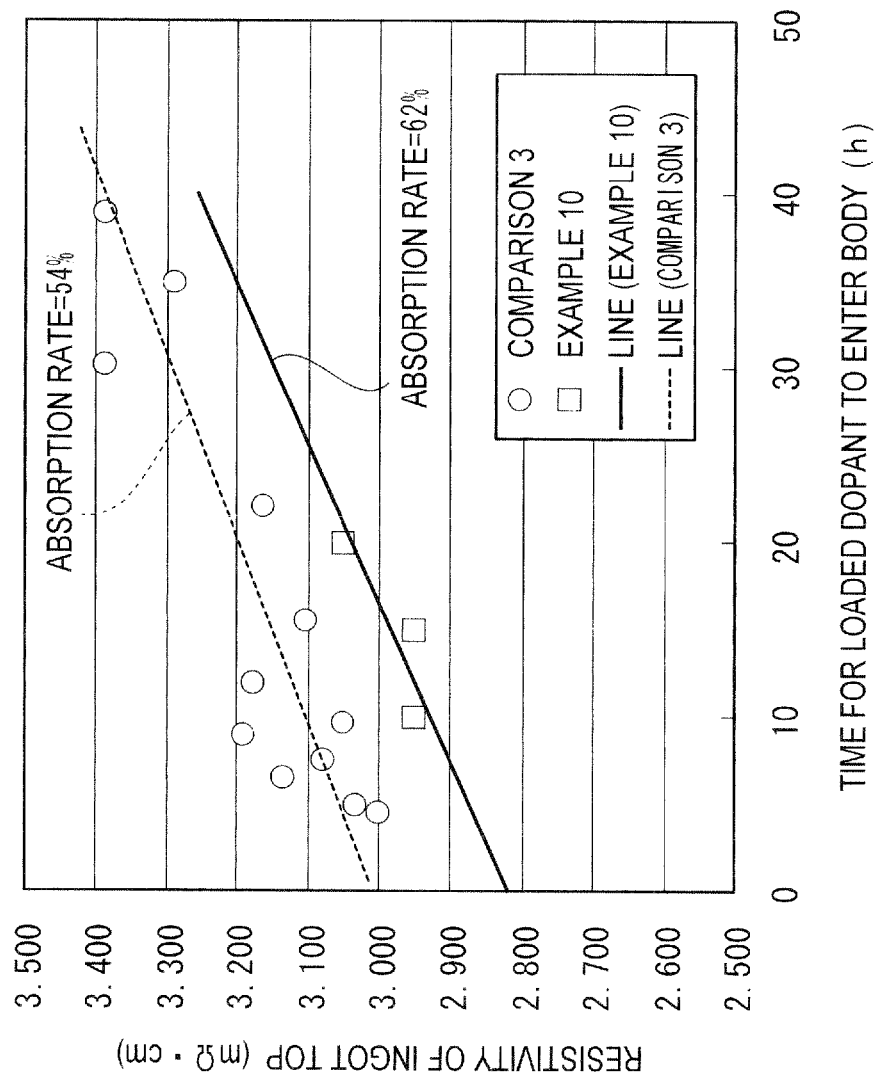
FIG. 21 is a graph showing comparative results of temporal dependence of resistivity of an ingot obtained by an example according to the fifth and sixth exemplary embodiments and a comparison.

When temporal dependence of the resistivity of the top of the pulled-up ingots was compared after doping the melt according to the methods of the example 10 and the comparison 3 as shown in FIG. 21, it was confirmed that the doping efficiency was enhanced and the resistivity was low as compared to the comparison 3 because no melt was blown off and the blowing speed was controlled in the example 10. It was also confirmed that the dopant absorption efficiency of the comparison 3 was 54%, whereas the dopant absorption efficiency of the example 10 was 62%, showing that the absorption efficiency was enhanced in the fifth and the sixth exemplary embodiments.

The invention claimed is:

1. A doping device for injecting a volatile dopant into a semiconductor melt, the device comprising:
    an accommodating portion which accommodates a solid dopant, the accommodating portion comprising an upper portion, a bottom portion disposed to face the upper portion, and a lateral portion disposed between outer peripheries of the upper portion and the bottom portion;
    a blow-preventing member which is provided above and spaced apart from the upper portion of the accommodating portion, the blow-preventing member preventing an inert gas which flows from above to below the accommodating portion from being directly blown to the accommodating portion;
    a cylindrical portion which has openings in upper and lower end surfaces thereof, the opening in the upper end surface being in communication with the accommodating portion to guide a volatilized dopant gas to the melt; and
    a heat-shielding member which covers at least a lower side of the accommodating portion to block a radiant heat from the melt to the accommodating portion.

2. The doping device according to claim 1, further comprising:
    an outer tube which comprises an opening in a lower end thereof, an upper portion arranged opposite to the opening, and a cylindrical lateral portion extending from a periphery of the upper portion toward the melt; and
    an inner tube which comprises the accommodating portion and the cylindrical portion;
    wherein:
        the outer tube accommodates the inner tube therein,
        the blow-preventing member comprises the upper portion of the outer tube, and the heat-shielding member is arranged to shield a space between the cylindrical portion of the inner tube and an inner circumference of the lateral portion of the outer tube.

3. The doping device according to claim 2, wherein:
a lower end of the lateral portion of the outer tube protrudes toward the melt relative to a lower end of the cylindrical portion of the inner tube.

4. The doping device according to claim 3, wherein:
a path is provided between the cylindrical portion of the inner tube and the outer tube, for re-introducing, to a surface of the melt, a part of the dopant gas blown from the lower end of the inner tube to the surface of the melt without being dissolved therein.

5. The doping device according to claim 2, wherein:
the heat-shielding member comprises a plurality of heat-shielding plates that are arranged to shield the space between the cylindrical portion of the inner tube and the inner circumference of the lateral portion of the outer tube,
a first heat-shielding plate of the plurality of heat-shielding plates closest to the accommodating portion of the inner tube is made of opaque quartz, and
a second heat-shielding plate closest to the melt is made of a graphite member.

6. A pull-up device, comprising:
the doping device according to claim 1;
a crucible containing a melt; and
a heat shielding shield covering a surface of the melt in the crucible and surrounding the doping device.

7. A doping device for injecting a volatilized dopant gas into a semiconductor melt, the device comprising:
an accommodating portion that accommodates a solid dopant;
a tube portion in which a gas ejected from the accommodating portion is introduced, the tube portion having an opening in a lower end surface, a lower end of the tube portion being arranged to be immersed in the melt;
wherein:
the tube portion has a cylindrical lateral portion, and
a plurality of through-holes are circumferentially provided in the lateral portion of the tube portion at a portion arranged to be immersed in the melt.

8. The doping device according to claim 7, further comprising:
a vane that protrudes outward from the tube portion and has a vane surface extending along an axis of the tube portion, the vane being provided on the portion of the tube portion arranged to be immersed in the melt adjacent to one of the plurality of through-holes.

9. The doping device according to claim 7, further comprising:
an inner tube which comprises the accommodating portion and a cylindrical portion which is connected to the accommodating portion; and
an outer tube which comprises the tube portion;
wherein:
the cylindrical portion has openings in upper and lower ends thereof, the accommodating portion being in communication with the upper end of the cylindrical portion to guide the volatilized dopant gas to the melt, the cylindrical portion not touching the melt, and
the outer tube accommodates the inner tube therein, and a lower end of the outer tube protrudes toward the melt relative to a lower end of the cylindrical portion.

10. The doping device according to claim 7, further comprising:
a plurality of vanes that protrude outward from the tube portion,
wherein each vane has a vane surface extending along an axis of the tube portion, and each vane is provided on the portion of the tube portion arranged to be immersed in the melt adjacent to a respective one of the plurality of through-holes.

* * * * *